US010600961B2

(12) United States Patent
Yi et al.

(10) Patent No.: US 10,600,961 B2
(45) Date of Patent: Mar. 24, 2020

(54) SCALABLE AND LOW-VOLTAGE ELECTROFORMING-FREE NANOSCALE VANADIUM DIOXIDE THRESHOLD SWITCH DEVICES AND RELAXATION OSCILLATORS WITH CURRENT CONTROLLED NEGATIVE DIFFERENTIAL RESISTANCE

(71) Applicant: HRL LABORATORIES, LLC, Malibu, CA (US)

(72) Inventors: Wei Yi, Moorpark, CA (US); Kenneth K. Tsang, Los Angeles, CA (US); Stephen K. Lam, Los Angeles, CA (US); Xiwei Bai, Simi Valley, CA (US); Jack A. Crowell, Camarillo, CA (US); Elias A. Flores, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/005,529

(22) Filed: Jun. 11, 2018

(65) Prior Publication Data
US 2019/0036023 A1   Jan. 31, 2019

Related U.S. Application Data

(60) Provisional application No. 62/537,797, filed on Jul. 27, 2017.

(51) Int. Cl.
H01L 47/00 (2006.01)
H01L 27/26 (2006.01)
H01L 45/00 (2006.01)

(52) U.S. Cl.
CPC .......... H01L 47/005 (2013.01); H01L 27/26 (2013.01); H01L 45/04 (2013.01);
(Continued)

(58) Field of Classification Search
None
See application file for complete search history.

(56) References Cited

U.S. PATENT DOCUMENTS 3,483,110 A * 12/1969 Rozgonyi ............. C23C 14/083
204/192.12
7,682,967 B2    3/2010 Kim et al.
(Continued)

OTHER PUBLICATIONS

Luo Zhen-Fei et al, "Study of nanocrystalline VO2 thin films prepared by magnetron sputtering and post-oxidation", 2010 Chinese Phys. B 19 106103 (Year: 2010).*
(Continued)

*Primary Examiner* — J. E. Schoenholtz
(74) *Attorney, Agent, or Firm* — Lewis Roca Rothgerber Christie, LLP

(57) ABSTRACT

A vanadium dioxide ($VO_2$)-based threshold switch device exhibiting current-controlled negative differential resistance (S-type NDR), an electrical oscillator circuit based on the threshold switch device, a wafer including a plurality of said devices, and a method of manufacturing said device are provided. The $VO_2$-based threshold switch device exhibits volatile resistance switching and current-controlled negative differential resistance from the first time a sweeping voltage or voltage pulse is applied across the device without being treated with an electroforming process. Furthermore, the device exhibits substantially identical switching characteristics over at least $10^3$ switching operations between a high resistance state (HRS) and a low resistance state (LRS), and a plurality of threshold switch devices exhibits a threshold voltage $V_T$ spreading of less than about 25%. The threshold switch device may be included in an oscillator circuit to produce an astable oscillator that may serve as a functional building block in spiking-neuron based neuromorphic computing.

18 Claims, 21 Drawing Sheets

(52) U.S. Cl.
CPC ........ *H01L 45/1233* (2013.01); *H01L 45/146* (2013.01); *H01L 45/1625* (2013.01); *H01L 47/00* (2013.01)

(56) References Cited

U.S. PATENT DOCUMENTS

| | | | |
|---|---|---|---|
| 8,324,976 | B2 | 12/2012 | Borghetti et al. |
| 10,153,729 | B2* | 12/2018 | Kumar .................... H03B 7/06 |
| 10,297,751 | B2 | 5/2019 | Yi et al. |
| 2012/0104346 | A1* | 5/2012 | Yi ........................ H04L 45/085 257/4 |
| 2012/0249252 | A1* | 10/2012 | Borghetti ................ H03B 7/00 331/132 |
| 2013/0026434 | A1 | 1/2013 | Yang et al. |
| 2013/0320286 | A1 | 12/2013 | Lee et al. |
| 2014/0027700 | A1* | 1/2014 | Nickel .................... H01L 45/08 257/3 |
| 2014/0029327 | A1* | 1/2014 | Strachan ................ H01L 45/04 365/148 |
| 2014/0203236 | A1* | 7/2014 | Chen ...................... H01L 45/16 257/4 |
| 2017/0244030 | A1* | 8/2017 | Park .................... H01L 27/2481 |

OTHER PUBLICATIONS

Jeong, Junho, et al. "Current Induced Polycrystalline-to-Crystalline Transformation in Vanadium Dioxide Nanowires." Scientific Reports, vol. 6, No. 1, 2016, doi:10.1038/srep37296. (Year: 2016).*

Velichko, Andrey, et al. "Modeling of Thermal Coupling in VO 2—Based Oscillatory Neural Networks." Solid-State Electronics, vol. 139, 2018, pp. 8-14., doi:10.1016/j.sse.2017.09.014. (Year: 2018).*

Taha, Mohammad, et al. "Insulator—Metal Transition in Substrate-Independent VO2 Thin Film for Phase-Change Devices." Scientific Reports, vol. 7, No. 1, 2017, doi:10.1038/s41598-017-17937-3. (Year: 2017).*

Pergament, A., et al. "Electrical Switching in Thin Film Structures Based on Transition Metal Oxides." Advances in Condensed Matter Physics, vol. 2015, 2015, pp. 1-26., doi:10.1155/2015/654840. (Year: 2015).*

Pergament, Alexander, et al. "Electrical Switching and Oscillations in Vanadium Dioxide." Physica B: Condensed Matter, vol. 536, 2018, pp. 239-248., doi:10.1016/j.physb.2017.10.123. (Year: 2018).*

Pergament, Alex & Crunteanu, Aurelian & Beaumont, Arnaud & Stefanovich, G & Velichko, Andrei. (2016). Vanadium Dioxide: Metal-Insulator Transition, Electrical Switching and Oscillations. A Review of State of the Art and Recent Progress. (Year: 2016).*

Chen, Sihai, et al. "Nanostructured Vanadium Dioxide Thin Films with Low Phase Transition Temperature." Applied Physics Letters, vol. 90, No. 10, 2007, p. 101117., doi:10.1063/1.2712427. (Year: 2007).*

Definition of substantial downloaded from URL< https://www.merriam-webster.com/dictionary/substantial> on Aug. 22, 2019 (Year : 2019).*

International Search Report and Written Opinion dated Sep. 28, 2018 for corresponding PCT Application No. PCT/US2018/038005 (13 pages).

* cited by examiner

Force V (V sweep)

Scale bar (white box): 50 nm

Scale bar (white box): 20 nm

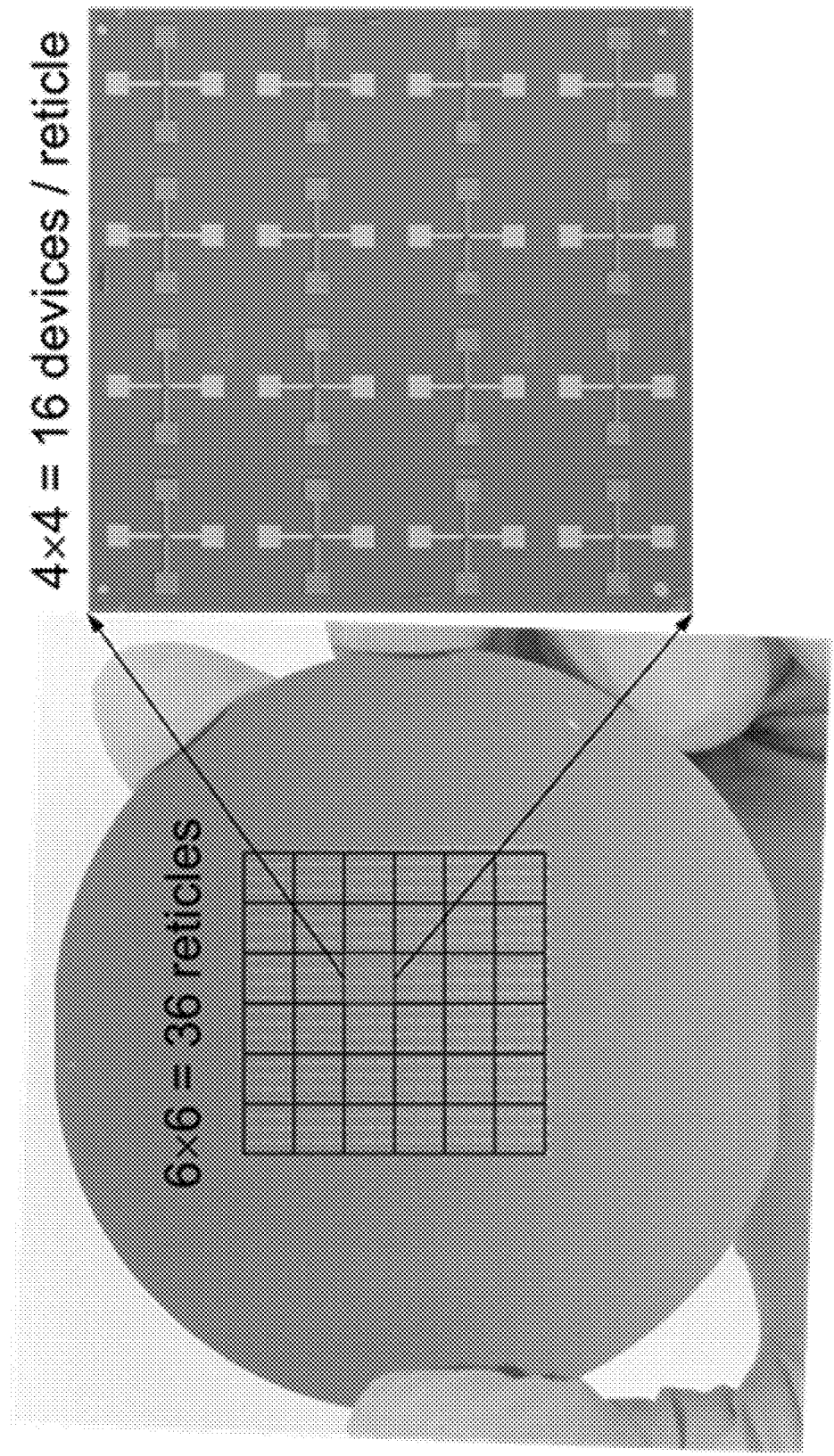

SCALABLE AND LOW-VOLTAGE ELECTROFORMING-FREE NANOSCALE VANADIUM DIOXIDE THRESHOLD SWITCH DEVICES AND RELAXATION OSCILLATORS WITH CURRENT CONTROLLED NEGATIVE DIFFERENTIAL RESISTANCE

CROSS-REFERENCE TO RELATED APPLICATION(S)

This application claims priority to and the benefit of U.S. Provisional Application No. 62/537,797, filed Jul. 27, 2017 and titled "ELECTROFORMING-FREE NANOSCALE VANADIUM DIOXIDE THRESHOLD SWITCH DEVICES WITH CURRENT-CONTROLLED NEGATIVE DIFFERENTIAL RESISTANCE", the entire content of which is incorporated herein by reference.

BACKGROUND

The present disclosure relates generally to threshold switch devices, and more specifically to vanadium dioxide ($VO_2$)-based threshold switch nanodevices exhibiting current-controlled negative differential resistance (S-type NDR). As used herein, the term "threshold switch" refers to a two-terminal device that undergoes a sudden change in its resistance when the voltage across the two terminals or the current flowing through it increases beyond a characteristic threshold value.

S-type NDR switch devices are well-suited for applications that require very low standby power dissipation, but are rare and not readily available. Furthermore, such switch devices in the related art typically have minimum threshold voltages that are inappropriate for lower power applications, and are also poorly scalable for high-density production and use. As such, the use and development of S-type NDR switch devices has been limited.

SUMMARY

Aspects of embodiments of the present disclosure provide a threshold switch device including: a complementary metal-oxide-semiconductor (CMOS)-compatible substrate; a first electrode on the CMOS-compatible substrate, the first electrode extending along a first direction; a second electrode on the first electrode, the second electrode extending along a second direction crossing the first direction; and a switching layer between the first electrode and the second electrode, the switching layer providing a first contact with the first electrode and a second contact with the second electrode at least along a thickness direction (TD) overlap of the device between the first electrode and the second electrode. The switching layer may be substantially composed of polycrystalline vanadium dioxide (VO2), and may have no epitaxial relationship with the CMOS-compatible substrate.

In some embodiments, the CMOS-compatible substrate may include a silicon layer below an upper substrate layer. The upper substrate layer may be composed of $SiO_2$, $SiN_x$, SiCN, SiCOH, porous SiCOH, or a mixture thereof.

In some embodiments, the first electrode may be within a trench in the CMOS-compatible substrate, and the first electrode and CMOS-compatible substrate may be planarized.

In some embodiments, at least one of the first electrode and the second electrode may include one or more layers of Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon.

In some embodiments, the switching layer may have the same planar area as the CMOS-compatible substrate.

In some embodiments, the switching layer may be a thin film having a thickness of about 5 nm to about 500 nm.

In some embodiments, the thin film may include nanocrystals having an average length of about 5 nm to about 500 nm. In some embodiments, the nanocrystals may be columnar and vertically continuous from a bottom edge to a top edge of the thin film.

In some embodiments, the threshold switch device may further include a dielectric layer on the first electrode and/or the CMOS-compatible substrate, wherein the dielectric layer defines a recess, and the switching layer is surrounded by the dielectric layer and positioned within the recess. The dielectric layer may be composed of $SiO_2$, $SiN_x$, $SiO_xN_y$, $Si_xN_yH_z$, SiCN, SiOF, SiCOH, porous SiCOH, phosphosilicate glass (PSG), borophosphosilicate glass (BSPG), borosilicate glass (BSG), or a mixture thereof.

In some embodiments, the threshold switch device may exhibit volatile resistance switching and current-controlled negative differential resistance from the first time a sweeping voltage or voltage pulse is applied across the device. The volatile resistance switching may be between a high resistance state (HRS) at zero bias and a low resistance state (LRS) above a threshold voltage bias. The threshold switch device may be a non-electroformed device.

Aspects of embodiments of the present disclosure provide an electrical oscillator circuit based on the threshold switch device. The electrical oscillator circuit may include: the threshold switch device; a load resistor connected in series with the threshold switch device; a reactive circuit element connected in parallel with the threshold switch device; and a DC voltage supply, wherein the oscillation frequency of the electrical oscillator circuit may be controlled by adjusting the DC voltage, adjusting the value of the load resistor, and/or adjusting the value of the reactive circuit element. In some embodiments, the reactive circuit element is a capacitor.

In some embodiments, the electrical oscillator circuit may be a regenerative switching circuit that continually oscillates between two states to produce sawtooth output waveforms. In some embodiments, the electrical oscillator circuit does not require an external assistance for operation.

Aspects of embodiments of the present disclosure provide a method of manufacturing a threshold switch device including: providing a complementary metal-oxide-semiconductor (CMOS)-compatible substrate; depositing a first electrode on the CMOS-compatible substrate to extend along a first direction; depositing a switching layer composed substantially of polycrystalline vanadium dioxide ($VO_2$) in a thin film over the first electrode, the switching layer having no epitaxial relationship with the CMOS-compatible substrate; and depositing a second electrode over the switching layer to extend along a second direction crossing the first direction; the switching layer having a first contact with the first electrode and a second contact with the second electrode at least along a thickness direction (TD) overlap of the device between the first electrode and the second electrode, wherein the threshold switch device is not subjected to an electroforming process prior to resistive switching. In some embodiments, the thin film may include nanocrystals that are columnar and vertically continuous from a bottom edge to a top edge of the thin film.

In some embodiments, the threshold switching device may exhibit volatile resistance switching and current-controlled negative differential resistance from the first time a sweeping voltage or voltage pulse is applied across the device.

BRIEF DESCRIPTION OF THE DRAWINGS

These and other features and advantages of embodiments of the present invention will be better understood by reference to the following detailed description when considered in conjunction with the accompanying drawings.

FIG. 8D is a circuit diagram for an astable Pearson-Anson relaxation oscillator circuit including a vanadium dioxide ($VO_2$) threshold switch device ($X_1$). FIG. 8A is an I-V plot showing the quasi-DC V-I characteristics of the $VO_2$ device ($X_1$) in the circuit of FIG. 8D upon sweeping the DC bias from about 0 V to about 1.6 V and then back to 0 V. Only a portion of the V-I characteristics, in the DC bias range from 0 V to 1.4 V, is displayed for clarity. In this plot, the voltage value of each data point reflects the total voltage drop across the oxide switching layer and the metal electrodes. FIG. 8B is a waveform diagram showing the output voltage ($V_{out}$) as a function of time in the circuit of FIG. 8D. FIG. 8C is a waveform diagram, rotated clockwise by 90 degrees to align with FIG. 8A, showing the current flowing through the $VO_2$ device $X_1$ as a function of time in the circuit of FIG. 8D.

FIG. 11A is a photographic image of the completed wafer of Example 2, which includes 36 reticles arranged in a six-row and six-column (6×6) array. 16 $VO_2$ crossbar threshold switch devices (numbered as device 1 to device 16) arranged in a four-row and four-column (4×4) array are fabricated within each reticle, for a total number of 576 devices on the same wafer.

DETAILED DESCRIPTION

Figure 1A:
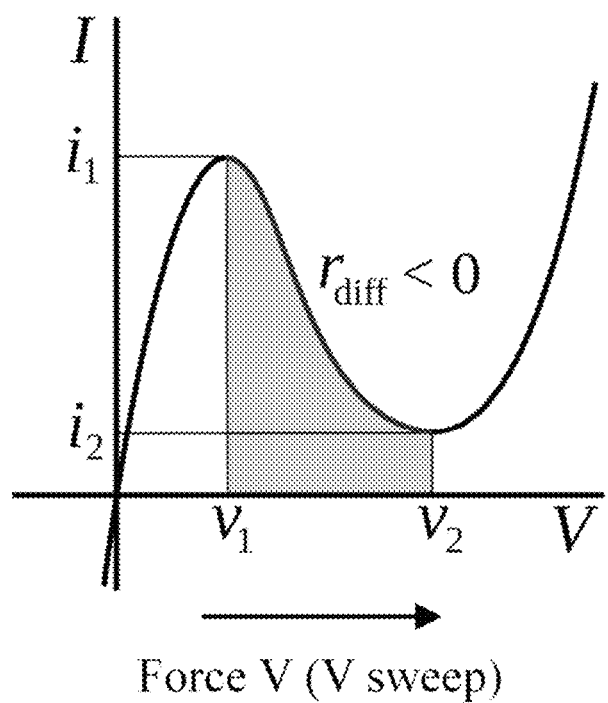
FIGS. 1A and 1B are schematic plots illustrating N-type and S-type NDR behavior, respectively, using the standard convention of voltage on the x-axis and current on the y-axis.

In the following detailed description, only certain example embodiments of the subject matter of the present disclosure are shown and described, by way of illustration. As those skilled in the art would recognize, the subject matter of the present disclosure may be embodied in many different forms, and should not be construed as being limited to the embodiments set forth herein.

In the context of the present application, when a first element is referred to as being "on", "coupled to", or "connected to" a second element, it can be directly on, directly coupled to, or directly connected to the second element, or can be indirectly on, indirectly coupled to, or indirectly connected to the second element with one or more intervening elements interposed therebetween. Like reference numerals designate like elements throughout the specification. The thicknesses and dimensions of layers, films, panels, regions, etc., may be exaggerated in the drawings for clarity. The drawings are not necessarily drawn to scale.

In the drawings, designations such as thickness direction (TD) and planar direction (PD) are provided for ease of reference to the relative orientations of elements in the illustrated embodiments. Such directional designations are relative to the orientation of the embodiment depicted in each drawing, and are not related to any absolute coordinate system. It will be understood that the directional designations do not limit the orientations of embodiments of the present disclosure. For example, the illustrated embodiments could be rotated along with their directional designations. In general, unless otherwise stated, the thickness direction will be understood to be substantially orthogonal to the planar direction.

The term "electroforming" is used herein in its art-recognized sense to refer to a process (processing technique) in which a device or material is subjected to an electric current having sufficiently high voltage and current density to induce electrochemical and/or structural changes in that material. The electrochemical and/or structural changes may be necessary to induce desired characteristics or behavior by way of producing a chemically distinct product in at least one portion or domain of the device or original material, as will be described herein with respect to the related art. The term "electroformed" is thus used to refer to a device or material that has been subjected to an electroforming process.

In contrast, the terms "electroforming-free" and "non-electroformed" may be used herein to refer to a device or material that has not been subjected to any electroforming process or processes. Further, it will be understood that the "electroforming-free" or "non-electroformed" device or material may have a particular or desirable material structure and/or may possess desirable performance characteristics during operation without being subjected to any electroforming process (e.g., even when not subjected to an electroforming process), as may be described herein and/or recited in the claims.

The terms "threshold switch" and "threshold switching device" are interchangeably used herein to refer to a two-terminal device that undergoes a sudden change in its resistance when the voltage across the two terminals or the current flowing through it increases beyond a characteristic threshold value.

The terms "resistance switching" and "resistive switching" are interchangeably used herein in their art-recognized senses to refer to a sudden change in the resistance of a device, for example, in response to a change in temperature, voltage, and/or current. The modifying term "volatile" is used in this context to indicate that the change in resistance is maintained only as long as the external change in applied temperature, voltage, current, etc., is maintained.

One or more aspects of example embodiments of the present disclosure provide an electroforming-free threshold switch device based on a single-phase polycrystalline vanadium dioxide ($VO_2$) thin film. The device may be a nanoscale device, for example, having a size as small as about 50 nm×about 50 nm, and may show highly reproducible volatile resistance switching with current-controlled S-type negative differential resistance (NDR) from the first time a sweeping voltage or voltage pulse is applied across the device. The switching endurance of the device may exceed at least $10^3$, or in some embodiments, $10^6$ switching operations without any sign of fatigue or drift in measured characteristics. One or more aspects of example embodiments of the present disclosure provide an electronic oscillating circuit based on the threshold switch device.

One or more aspects of example embodiments of the present disclosure provide a wafer including a plurality (e.g., two or more, or for example 576 or more) of the electroforming-free threshold switch devices. The device yield (e.g., the proportion or percentage of viable devices) may be greater than about 96%, e.g., 556 or more devices out of all the 576 devices fabricated on the wafer may show NDR switching without being subjected to electroforming.

Furthermore, one or more aspects of example embodiments of the present disclosure provide a method of fabricating the electroforming-free low-voltage vanadium dioxide ($VO_2$) threshold switch nanodevice. The method is based on a method of fabricating nearly single-phase polycrystalline $VO_2$ thin films.

Devices exhibiting negative differential resistance (NDR) are locally-active one-port (i.e., two terminal) circuit elements. Here, the term "negative differential resistance (NDR)" describes a resistive behavior in which the voltage drop across a device decreases with increased driving current over at least a portion of the operating current range. As such, the slope (differential) of the corresponding I-V curve is negative. For example, the differential resistance $r_{diff}$ as defined by $r_{diff}=dV/dI$ is locally negative. Such a behavior contrasts with that of an ordinary resistor having a fixed resistance, in which the current increases proportionately to voltage according to Ohm's law (i.e., V=I·r, where V is voltage, I is current, and r is resistance), and $r_{diff}$ is therefore always positive. When integrated into an appropriate or suitable external circuit, an NDR device can serve as an amplifier with an AC power gain greater than 1. In other examples, an NDR device may excite oscillations in a resonant circuit to thereby produce an oscillator.

Figure 1B:
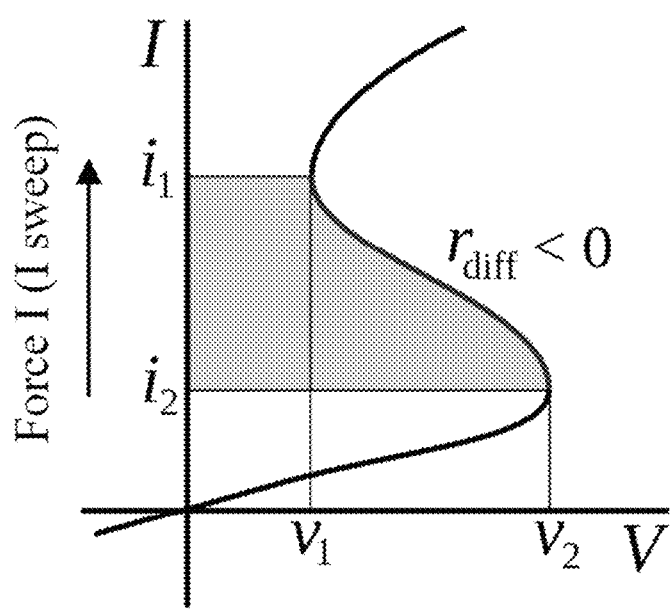

NDR devices may be generally classified into two categories: current-controlled (CC-NDR), or S-type; and voltage-controlled (VC-NDR), or N-type, where "S" and "N" refer to the characteristic shapes of the I-V curves when plotted with voltage on the x axis. The terms "CC-NDR" and "S-type NDR" may be used interchangeably herein, and the terms "VC-NDR" and "N-type NDR" may be used interchangeably herein. FIGS. 1A and 1B are schematic plots illustrating N-type and S-type NDR behavior, respectively, using the standard convention of voltage on the x-axis and current on the y-axis. In FIG. 1A, the voltage of the device is swept, and the current flowing through the N-type NDR device decreases with increased driving voltage over the shaded portion of the operating voltage range (between $v_1$ and $v_2$). As such, the slope (differential) of the corresponding V-I curve in this region is negative. In FIG. 1B, the current across the device is swept, and the voltage drop across the N-type NDR device decreases with increased current over the shaded portion of the operating current range (between $i_1$ and $i_2$). The device exhibits negative resistance within this AC domain, i.e., dV/dI<0.

N-type NDR devices are readily available, and include Esaki diodes, resonant tunnel diodes (RTD), Gunn diodes, impact ionization avalanche transit time (IMPATT) diodes, and tunnel injection transit time (TUNNETT) diodes. However, N-type devices are normally cony (e.g., they maintain a low resistance state (LRS) when powered off), and are therefore not suitable for applications that require low standby power dissipation, such as spike-based neuromorphic computing.

In contrast, S-type NDR devices are normally 'off' (e.g., they maintain a high resistance state (HRS) when powered off), and are therefore suitable for applications that require very low standby power dissipation. However, S-type NDR devices are rare and not readily available. One example of an S-type NDR device is a silicon (Si) pnpn switch (thyristor), which includes silicon-controlled rectifiers (SCRs) and triacs. However, the minimal threshold voltage of a Si thyristor is typically about 8 V, which is too high for many low-power applications. Although this voltage can be reduced to about 2 V by controlling the gate trigger current, this requires additional circuit elements (such as Zener diodes), which adds to circuit cost and complexity. In addition, Si pnpn devices are non-stackable and poorly scalable for high-density integration.

Figure 2:
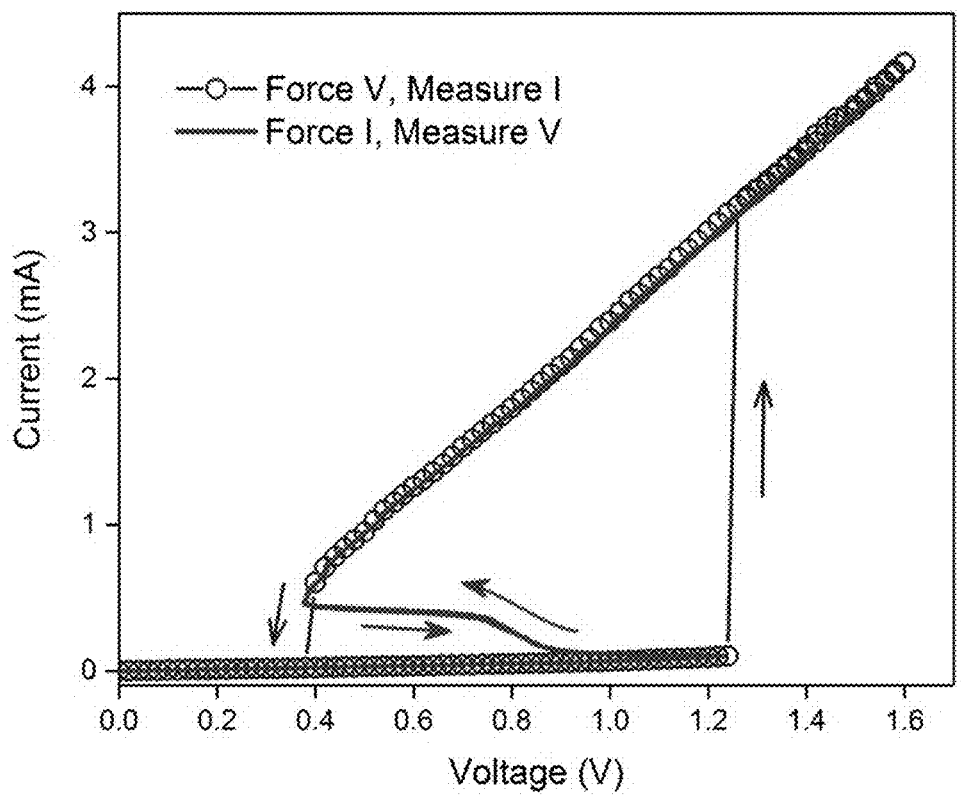
FIG. 2 is a current-voltage plot showing I-V curves (circle trace is a voltage sweep, solid trace is a current sweep) generated by an example metal-oxide-metal (MOM) crossbar threshold switch device having current-controlled negative differential resistance, which is observable in the current sweep (solid trace). In this plot, the voltage value of each data point reflects the total voltage drop across the oxide switching layer and the metal electrodes.

FIG. 2 is a current-voltage plot showing the experimental I-V curves produced by an example S-type NDR $VO_2$ nano-crossbar device according to embodiments of the present disclosure (as will be discussed in detail herein). The circle trace (Force V, Measure I mode) corresponds to the I-V curve produced by sweeping the device voltage (V) between about 0 V to about 1.6 V (e.g., under voltage control), and measuring the device current (I). In this plot, the voltage was measured using a 2-terminal method, and the voltage value of each data point reflects the total voltage drop across the oxide switching layer and the metal electrodes.

In Force V, Measure I mode, the device shows pronounced hysteresis, and the output I depends not only on the present applied input V, but also on the past history of input V. This hysteresis is a result of nearly-instantaneous insulator-to-metal switching (upward arrow, at a threshold voltage of about 1.2 V) and metal-to-insulator switching (downward arrow, at a hold voltage of about 0.4 V). Meanwhile, the solid line (Force I, Measure V mode) corresponds to the I-V curve produced by sweeping the device current (I) between about 0 mA to about 4 mA (e.g., under current control), and measuring the device voltage (V). In Force I, Measure V mode, the device shows a lower degree of hysteresis, and an "S"-shaped negative differential resistance between about 0.4 V to about 1.2 V (as shown by the negative slope of the I-V curve in that voltage range) is clearly observed. Here the observed threshold current (needed to initiate the transition to a metallic state) is about 100 µA, and the holding current (needed to maintain the metallic state) is about 400 µA.

Certain types or kinds of metal-oxide-metal (MOM) devices, which include a thin layer of a transition metal oxide (TMO) sandwiched between the metal layers, are known to act as S-type NDR threshold switches. One class of physical mechanism that can give rise to S-type NDR phenomenon in TMO materials is a thermodynamically-driven structural and electronic phase transition (between an insulator phase and a metal phase), as described by Mott transition theory in Mott, N. F., "The Basis of the Electron Theory of Metals, with Special Reference to the Transition Metals", *Proc. Phys. Soc.* (London) A62 (7), 416-422 (1949), the entire content of which is incorporated herein by reference. Examples of such TMO materials capable of Mott transitions include binary oxides, such as Magnéli phases (e.g., $M_nO_{2n-1}$, where M=V, Nb, or Ti, and n is an integer greater than 0), and ternary perovskite oxides such as $RMO_3$ (where R is a rare earth cation such as Pr, Nd, or Sm, and M is a 3d transition metal such as Ni or Co). However, many of these materials have relatively low transition temperatures (e.g., may undergo Mott transitions at temperatures well below room temperature or about 25° C.), which reduces the utility of these materials as threshold switches in many electronic applications. Materials with a transition temperature at or above room temperature (such as vanadium dioxide ($VO_2$) and niobium dioxide ($NbO_2$)) are more suitable for such applications. Furthermore, the Mott transitions in these materials may be controllably triggered by the application of a sufficiently high current to reach the critical temperature by Joule heating, instead of by using a separate heating element, which would increase circuit complexity and impair scalability. The critical temperatures in binary TMO materials (such as $VO_2$ and $NbO_2$) can be shifted higher or lower by introducing a third element, such as W, Ti, or Ge.

Figure 3:
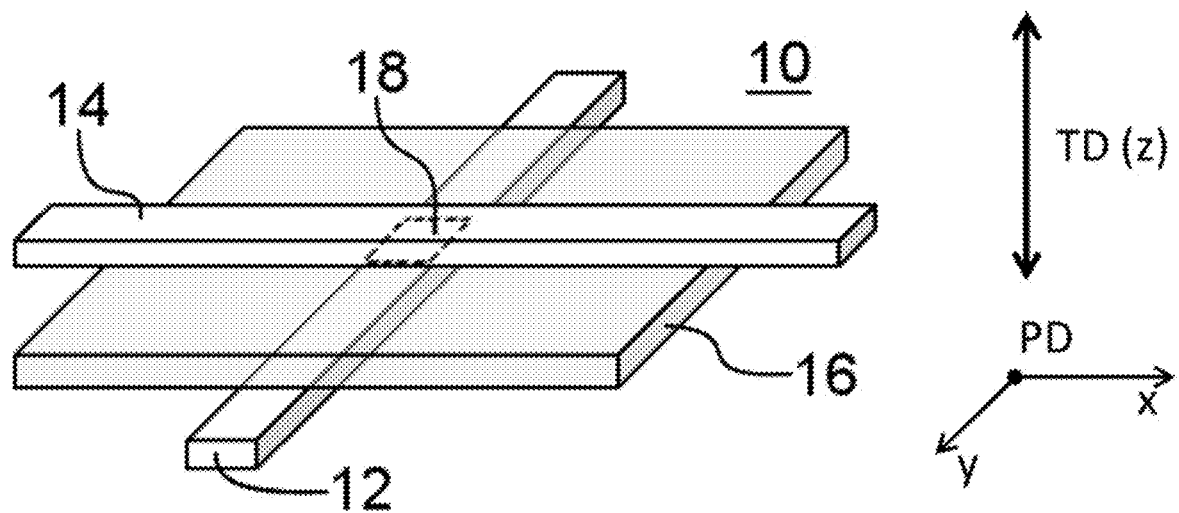
FIG. 3 is a schematic view of an example combination of MOM layers that would be included in an MOM crossbar threshold switch device, including a bottom electrode, a top electrode, and a metal oxide thin film between the bottom electrode and the top electrode.

FIG. 3 is a schematic view of an example combination of MOM layers 10 that would be included in an MOM crossbar threshold switch device. In the combination of MOM layers 10, a bottom electrode 12 having a length greater than its width extends along a first direction (e.g., along its length direction). As used herein, the terms "extending along", "extends along", etc. are used to describe the orientation of the longest dimension of an element, for example, that the element has a longest dimension (e.g., length) in the stated direction. A top electrode 14 having a length greater than its width extends along a second direction crossing the first direction. In some embodiments, the first direction and the second direction may be substantially perpendicular or substantially orthogonal to each other, however, the crossing angle is not particularly limited. A TMO thin film 16 is between the bottom electrode 12 and the top electrode 14, such that opposing sides of the thin film 16 are in direct physical contact with one of each electrode. The bottom electrode 12, the metal oxide thin film 16, and the top electrode 14 correspond to the Metal, Oxide, and Metal layers, respectively, stacked along a thickness direction (TD) of the MOM threshold switch device.

In FIG. 3, the bottom electrode 12 and the top electrode 14 overlap along at least a portion of each of the bottom electrode 12 and the top electrode 14 in the thickness direction (TD) of the combined layers, for example, along the stacking direction of the layers or along a direction normal to each of the interfaces between layers (e.g., along the z-axis direction, as labeled). This TD overlap may be referred to as the active area 18, and may have any suitable shape and/or cross-sectional (lateral or planar direction) area. The layouts and physical configurations of the MOM layers in MOM threshold switches according to embodiments of the present disclosure are not limited to the example described in FIG. 3, and other suitable layouts may be possible, as further described below.

Low voltage MOM crossbar-shape threshold switches in the related art have been produced by subjecting radio frequency (RF) sputtered $V_2O_5$-based MOM devices to an electroforming process to thereby form nanoscale $VO_2$ conduction channels within the $V_2O_5$, as described in U.S. patent application Ser. No. 15/417,049, filed Jan. 26, 2017 and titled "Low-Voltage Threshold Switch Devices with Current-Controlled Negative Differential Resistance Based on Electroformed Vanadium Dioxide Layer," the entire content of which is incorporated herein by reference. Such devices were found to have threshold voltages of about 0.5 V and large resistance On/Off ratios greater than 100. However, due to the stochastic nature of electroforming mechanisms, the resulting $VO_2$ crystal volume and related device characteristics such as threshold voltage are subject to statistical variations, and wide performance variations (spreading) were observed between devices, particularly with respect to the threshold voltage. Electroformed devices have been further limited by many additional drawbacks, including low device yield, high circuit overhead when used in integrated circuit (IC) applications, and operational instability (e.g. drift in switching characteristics).

According to embodiments of the present disclosure, a threshold switch device including a vanadium dioxide ($VO_2$) thin film over a CMOS-compatible substrate provides resistive switching behavior without electroforming and without the need for an epitaxial substrate. The threshold switch device according to embodiments of the present disclosure includes: a complementary metal-oxide-semiconductor (CMOS)-compatible substrate; a first electrode on the CMOS-compatible substrate, a second electrode on the first electrode, and a switching layer between the first electrode and the second electrode. The first electrode extends along a first direction, and the second electrode extends along a second direction crossing the first direction. The switching layer provides a first contact with the first electrode and a second contact with the second electrode at least along a thickness direction (TD) overlap of the device between the first electrode and the second electrode. The switching layer is substantially composed of polycrystalline vanadium dioxide, and does not have an epitaxial relationship with the CMOS-compatible substrate.

The physical arrangement or layout of the substrate, electrodes, and switching layer of the threshold switch device (e.g., with respect to the other components) may be any suitable layout used for MOM switches in the related art. One or more suitable layouts are illustrated in connection with the figures. However, it will be understood that embodiments of the present disclosure are not limited thereto, and various modifications of the described layouts or additional layouts not explicitly depicted in the present disclosure may be possible.

Figure 4A:
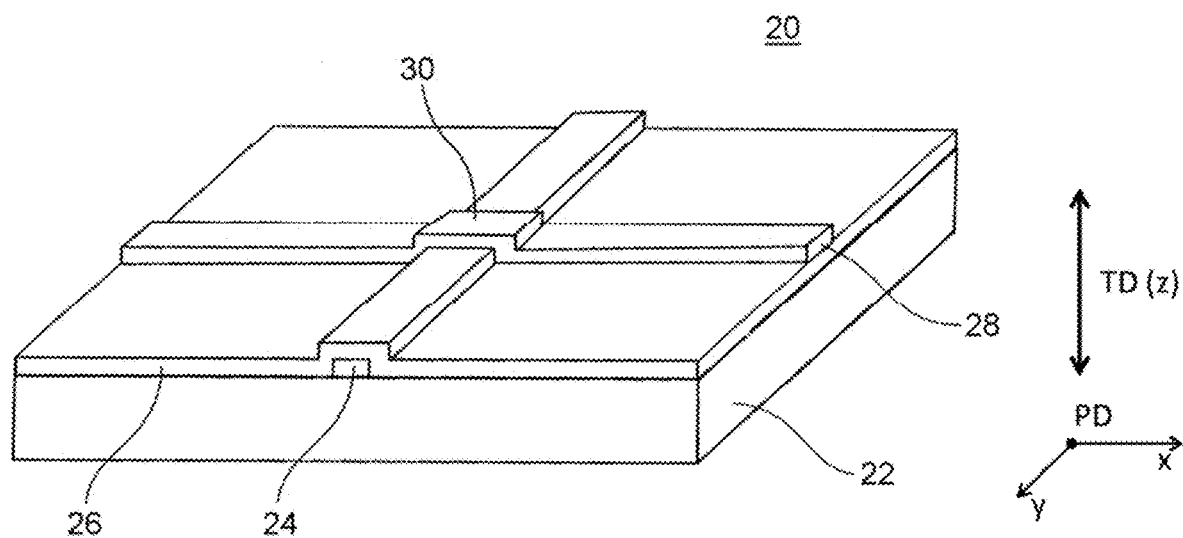
FIG. 4A is a schematic plan view diagram of an example MOM threshold switch that includes a substrate having a flat upper surface; a first electrode extending along a first direction on the substrate, and a switching layer over and substantially covering the first electrode and the portions of the substrate that are not covered by the first electrode. A second electrode is positioned on the switching layer and extends along a second direction crossing the first direction, such that at least a portion of the switching layer is directly between the first electrode and the second electrode along the thickness direction at a crossing region. In the device of FIG. 4A, the switching layer has the same planar area as the substrate.

FIG. 4A is a schematic plan view diagram of an example MOM threshold switch 20 that includes a substrate 22 having a flat upper surface; a first electrode 24 extending along a first direction on the substrate 22, and a switching layer 26 over and substantially covering (e.g., blanketing) the first electrode 24 and the portions of the substrate 22 that are not covered by the first electrode 24. For example, the switching layer 26 has the same planar area as the substrate 22. The switching layer 26 forms a step (e.g., a portion having a higher elevation) over the portion of the switch 20 that includes the first electrode 24 on the substrate 22. A second electrode 28 is positioned on the switching layer 26 and extends along a second direction crossing the first direction, such that at least a portion of the switching layer 26 is directly between the first electrode 24 and the second electrode 28 (e.g., over the first electrode 24 and under the second electrode 28) along the thickness direction (TD) at a crossing region 30. The second electrode 28 may also form a step over the portion of the switch 20 that includes the first electrode 24 on the substrate 22. The substrate 22, first electrode 24, switching layer 26, and second electrode 28 are stacked along the thickness direction. The switching layer 26 provides a first (planar) contact with the first electrode 24 and a second (planar) contact with the second electrode 28 at least along the thickness direction (TD) overlap of the device of the electrodes 24 and 28 within the crossing region 30.

Figure 4B:
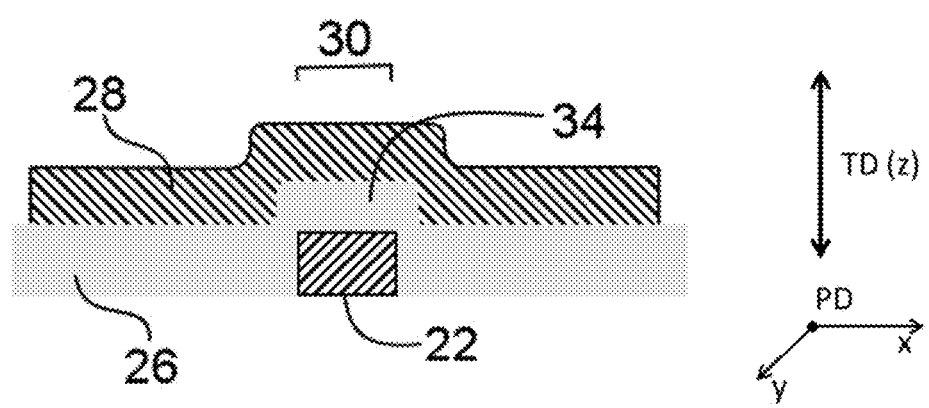
FIG. 4B is a schematic cross-sectional view of the MOM threshold switch of FIG. 4A along the center length of the second electrode.

FIG. 4B is a schematic cross-sectional view of a central portion of the MOM threshold switch 20 along the center length of the second electrode 28 in FIG. 4A, showing the relative positions of the first electrode 24, the switching layer 26, and the second electrode 28. The cross-section of the crossing region 30 within the switching layer 26 is seen between the TD overlap of the two electrodes 26 and 28, where the switching layer provides the first contact 32 with the first electrode 24 and the second contact 34 with the second electrode 28.

Figure 5:
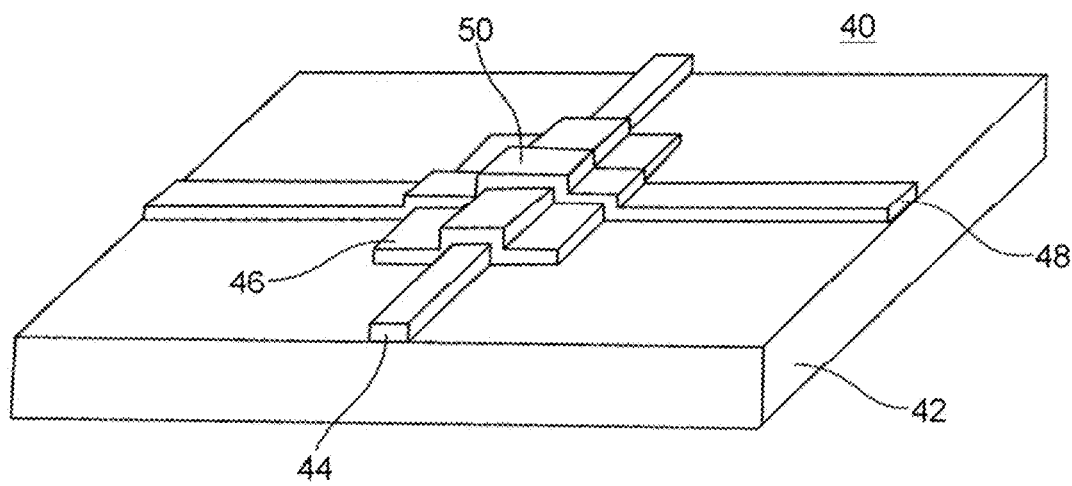
FIG. 5 shows a top view of an example MOM threshold switch similar to the MOM threshold switch of FIG. 4A, except the switching layer covers only a portion of the top surface of the substrate, and one or more portions are left uncovered.
Figure 5:
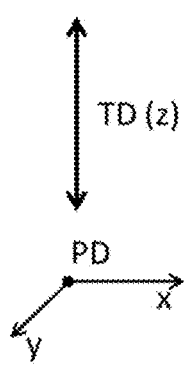

In some embodiments, the switching layer may not blanket or substantially cover the first electrode or the substrate. For example, the switching layer may only cover a portion of the first electrode and/or substrate. FIG. 5 shows a top view of an example MOM threshold switch 40 including a substrate 42 having a flat upper surface; a first electrode 44 extending along a first direction on the substrate 42, and a switching layer 46 over a portion of the first electrode 44 and a portion of the substrate 42. The switching layer 46 forms a step over the portion of the switch 40 that includes the first electrode 44 on the substrate 42. A second electrode 48 is positioned on the switching layer 46 and extends along a second direction crossing the first direction, such that at least a portion of the switching layer 46 is directly between the first electrode 44 and the second electrode 48 (e.g., over the first electrode 44 and under the second electrode 48) along the thickness direction at a crossing point 50. One or more portions of the top surface 52 of the substrate 42 are therefore left uncovered (e.g., are not covered by additional layers). The switching layer 46 provides a first contact with the first electrode 44 and a second contact with the second electrode 48 at least along the thickness direction (TD) overlap at the crossing point 50.

FIG. 5 depicts a MOM threshold switch in which the switching layer 46 is deposited over approximately (about) a third of the length of the first electrode 44 and under approximately (about) a fourth of the length of the second electrode 48. However, the planar shape and area (e.g., planar direction surface are) of the switching layer 46 is not particularly limited, as long as the first electrode and the second electrode do not directly contact each other. For example, the switching layer 46 should at least span the crossing region 50 or other overlap between the first electrode 44 and the second electrode 48. In some embodiments, the switching layer may be deposited only within the crossing region between the first and second electrodes.

Figure 6A:
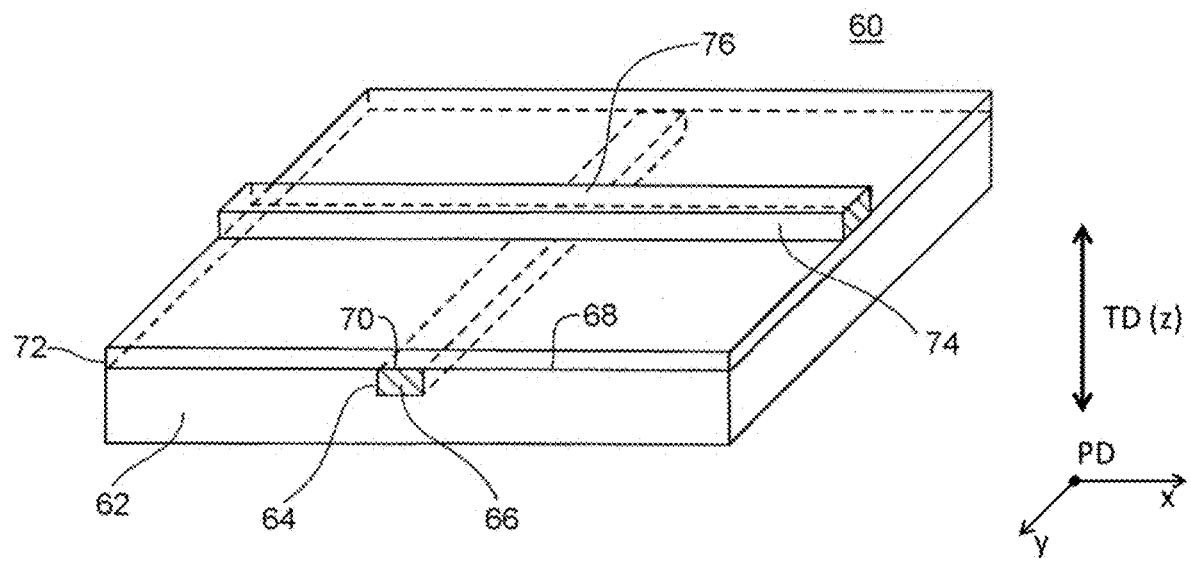
FIG. 6A is a schematic plan view diagram of an example MOM threshold switch similar to the MOM threshold switch of FIG. 4A, except that the substrate includes a trench extending along a first direction within the substrate, and the first electrode extends along the first direction within the trench 64.

In some embodiments, the first electrode may be planarized so that one or more steps are not formed in the overlying switching layer. In some embodiments, the first electrode may be planarized by including a trench in the substrate. FIG. 6A is a schematic plan view diagram of an example MOM threshold switch 60 that includes a substrate 62 including a trench 64 extending along a first direction within the substrate 62, and a first electrode 66 also extending along the first direction within the trench 64. The first electrode 66 has a thickness substantially equivalent to the depth of the trench 64 so that the upper surface 68 of the substrate 62 and the upper surface 70 of the first electrode 66 are flush or co-planar (e.g., planarized). As such, a switching layer 72 deposited over at least a portion of the substrate 62 and at least a portion of the first electrode 66 within the trench 64 is also substantially planar, and does not include any steps. A second electrode 74 is positioned on the switching layer 72 and extends along a second direction crossing the first direction, such that at least a portion of the switching layer 72 is directly between the first electrode 66 and the second electrode 74 (e.g., over the first electrode 66 and under the second electrode 74) along the thickness direction at a crossing region 76. When the switching layer 72 substantially covers (e.g., blankets) the device, the second electrode 74 is substantially planar and does not include any steps because the underlying switching layer 72 is substantially planar, as described above. However, the drawing is not intended to be limiting, and in some embodiments, the switching layer 72 may not cover the entire surface area of the device, and one or more steps may be formed in the overlaying second electrode 74 at the outer boundaries of the switching layer 72. The substrate 62, first electrode 66 within the trench 64, switching layer 72, and second electrode 74 are stacked along the thickness direction. The switching layer 72 provides a first (planar) contact with the first electrode 66 and a second (planar) contact with the second electrode 74 at least along the thickness direction (TD) overlap of the electrodes 66 and 74 within the crossing region 76.

Figure 6B:
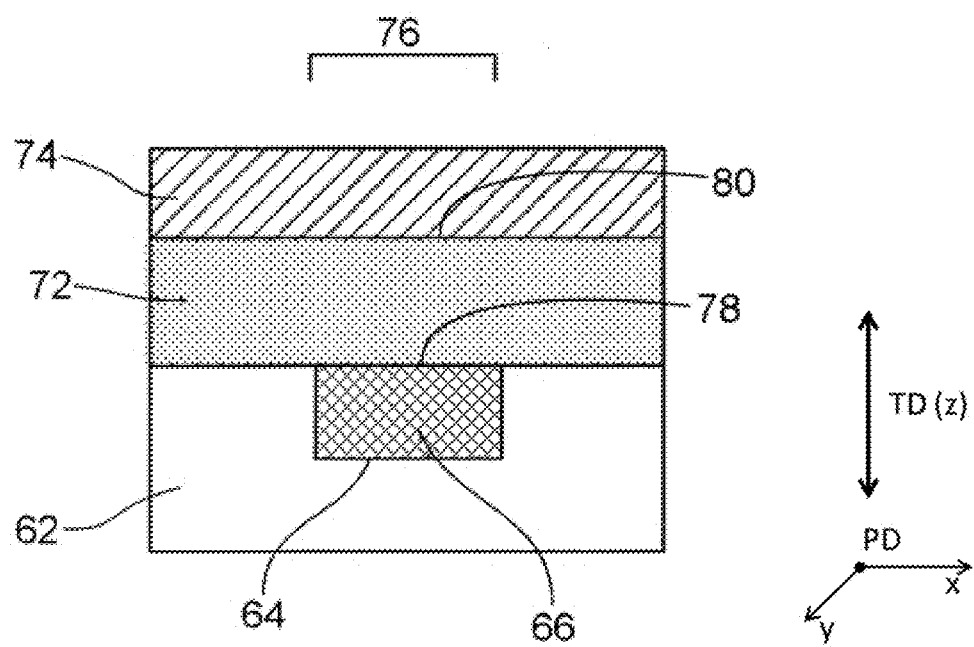
FIG. 6B is a schematic cross-sectional view of the MOM threshold switch of FIG. 6A along the center length of the second electrode.

FIG. 6B is a schematic cross-sectional view of a central portion of the MOM threshold switch 60 along the center length of the second electrode 74 in FIG. 6A, showing the relative positions of the trench 64 within the substrate 62, the first electrode 66 in the trench 64, the switching layer 72, and the second electrode 74. The cross-section of the crossing region 76 within the switching layer 72 is seen between the TD overlap of the two electrodes 66 and 74, where the switching layer provides the first contact 78 with the first electrode 66 and the second contact 80 with the second electrode 74.

Figure 7A:
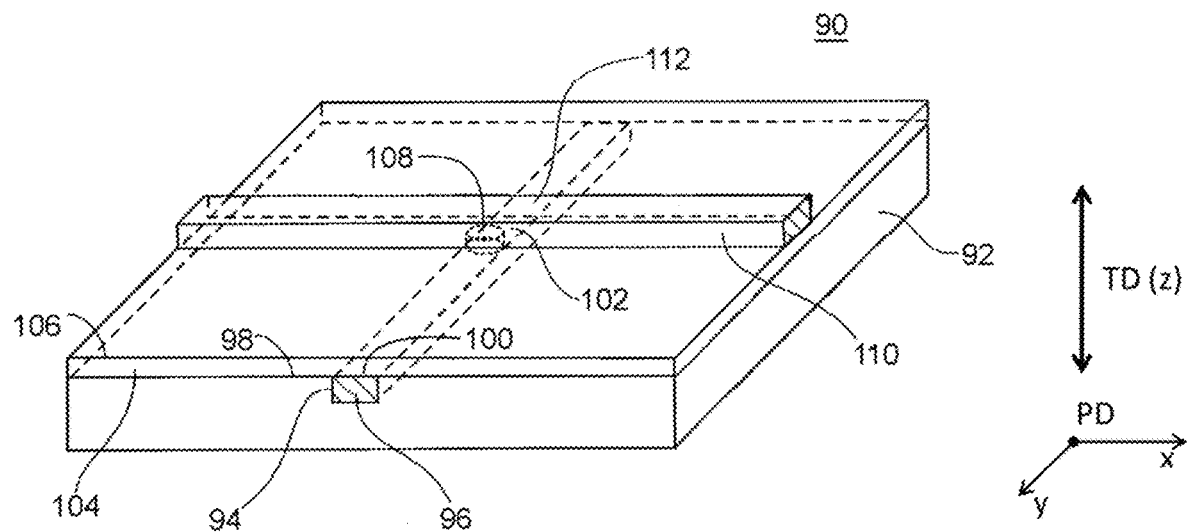
FIG. 7A is a schematic plan view diagram of an example MOM threshold switch similar to the MOM threshold switch of FIG. 6A, except that a dielectric layer is deposited over at least a portion of the first electrode within the trench to define a recess, and the switching layer is surrounded by the dielectric layer in a planar direction and positioned within the recess.

In some embodiments, the first electrode may be planarized as described above, and a switching layer that does not cover the entire surface area of the device may be planarized using a CMOS-compatible dielectric layer (e.g., the switching layer may be embedded in a CMOS-compatible dielectric layer) so that any layers deposited thereon are also planar. FIG. 7A is a schematic plan view of an example MOM threshold switch 90 that includes a substrate 92 including a trench 94 extending along a first direction within the substrate 92, and a first electrode 96 also extending along the first direction within the trench 94. The first electrode 96 has a thickness substantially equivalent to the depth of the trench 94 so that the upper surface 98 of the substrate 92 and the upper surface 100 of the first electrode 96 are flush or co-planar (e.g., planarized). As such, a switching layer 102 deposited over at least a portion of the first electrode 96 within the trench 94, and in some embodiments also deposited over at least a portion of the substrate 92 is also substantially planar, and does not include any steps. The switching layer 102 is surrounded in a planar direction by a CMOS-compatible dielectric layer 104 that covers (blankets) any portion of the first electrode 96 and substrate 92 that is not covered by the switching layer 102. The switching layer 102 has a height substantially equivalent to the height of the dielectric layer 104 so that the upper surface 106 of the switching layer 102 and the upper surface 108 of the dielectric layer 104 are flush or co-planar (e.g., planarized). A second electrode 110 is positioned on the switching layer 102, and in some embodiments also on at least a portion of the dielectric layer 104, so that it extends along a second direction crossing the first direction and is substantially planar (e.g., does not include any steps). Further, at least a portion of the switching layer 102 is directly between the first electrode 96 and the second electrode 106 (e.g., over the first electrode 96 and under the second electrode 106) along the thickness direction at a crossing region 112.

From an alternate point of view, the dielectric layer 104 may be deposited over at least a portion of the first electrode 96 within the trench 94 to define a recess, and the switching layer 102 may be surrounded by the dielectric layer in a planar direction and positioned within the recess.

Figure 7B:
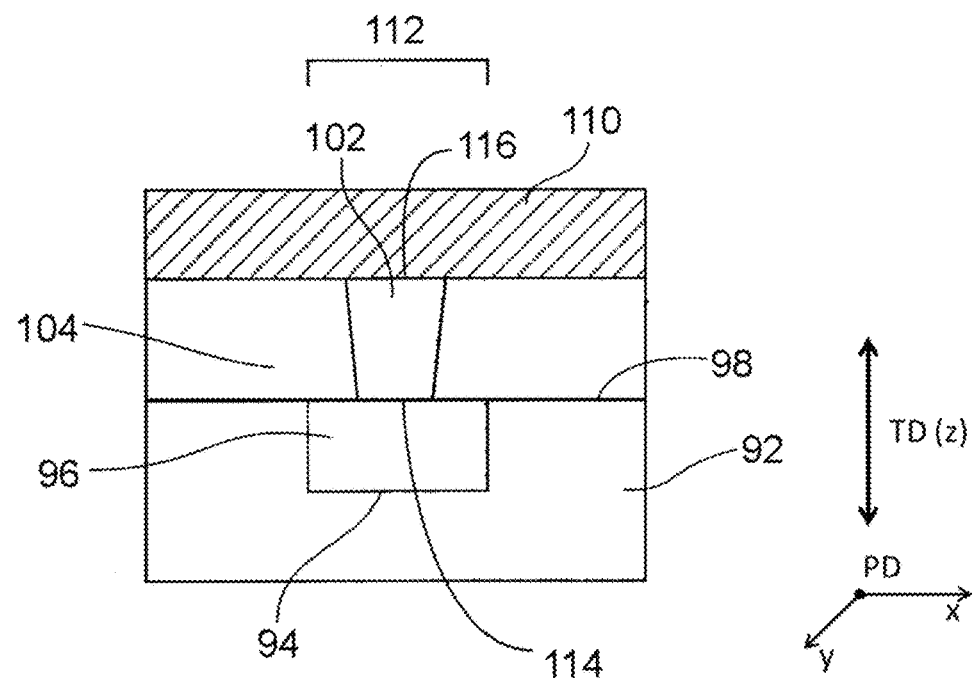
FIG. 7B is a schematic cross-sectional view of the MOM threshold switch of FIG. 7A along the center length of the second electrode.

FIG. 7B is a schematic cross-sectional view of the MOM threshold switch 90 along the center length of the second electrode 110 in FIG. 7A, showing the relative positions of the trench 94 within the substrate 92, the first electrode 96 in the trench 64, the switching layer 102 surrounded in a planar direction by the dielectric layer 104, and the second electrode 110. The cross-section of the crossing region 112 within the switching layer 102 is seen between the TD overlap of the two electrodes 96 and 106, where the switching layer 102 provides the first contact 114 with the first electrode 96 and the second contact 116 with the second electrode 106.

FIG. 7B illustrates an embodiment in which the switching layer 102 corresponds to or is contained within the crossing region 112, has a truncated cone shape, and has a cross-section with a trapezoidal shape. As such, the planar area of the first contact 114 is smaller than the planar area of the second contact 116. However, embodiments of the present disclosure are not limited thereto. In some embodiments, for example, the truncated cone shape of the switching layer 102 may be inverted so that the planar area of the first contact is larger than the planar area of the second contact 116. In either case, the angle of the truncated cone is not particularly limited as long as the switching layer can be deposited as a substantially uniform layer, for example, using the methods described herein. In some embodiments, the switching layer 102 may have a substantially cylindrical shape so that its cross-section has a rectangular shape and the areas of the first contact 114 and the second contact 116 are substantially similar. In some embodiments, the switching layer 102 may have a substantially prismatic shape, and/or may have a planar direction area extending beyond the boundaries of the crossing region 102.

Similarly, FIGS. 4A-7B depict example embodiments in which the first electrode and the second electrode are illustrated as rectangular prisms. However, embodiments of the present disclosure are not limited thereto. In some embodiments, for example, each of the first electrode and the second electrode may independently be thin films, trapezoidal prisms, etc., as long as each can be deposited as a substantially uniform layer and can be oriented to allow for layer planarization, as necessitated by the design of the embodiment.

Additional embodiments of the present disclosure may be provided by combining aspects of two or more of the embodiments illustrated in FIGS. 4A-7B. In some embodiments, for example, a first electrode may be deposited on a substrate, a switching layer may be deposited over a portion of the first electrode and/or a portion of the substrate, and a CMOS-compatible dielectric layer may be deposited over remaining portions of the first electrode and substrate to thereby planarize the switching layer. It will be understood that such combinations and variations of the MOM switch device layouts presented herein should be within the scope of knowledge of those having ordinary skill in the art.

The characteristics of each of the components of the example MOM switch devices will now be described.

The threshold switch device according to an embodiment of the present disclosure may include a CMOS-compatible substrate. The CMOS-compatible substrate may have a single layer structure or a multi-layered structure. The thickness of the CMOS-compatible substrate and/or each of its constituent layers are not particularly limited. Each layer of the CMOS-compatible substrate may be formed of a (Si)-containing dielectric material. In some embodiments, for example, a layer of the CMOS-compatible substrate may be formed of undoped or doped Si, silicon dioxide ($SiO_2$), silicon nitride ($SiN_x$), silicon oxynitride ($SiO_xN_y$), hydrogenated silicon nitride ($Si_xN_yH_z$), silicon carbon nitride (SiCN), silicon oxyfluoride (SiOF), hydrogenated silicon oxycarbide (SiCOH), porous SiCOH, or a combination thereof. In some embodiments, the CMOS-compatible substrate may include two layers, including a first lower layer formed of Si under a second upper layer formed of $SiO_2$, $SiN_x$, SiCN, SiCOH, porous SiCOH, or a mixture thereof.

In some embodiments, the uppermost layer of the CMOS-compatible substrate, (e.g., the layer that may contact the first electrode and/or the switching layer), may be formed of a material that cannot and does not form an epitaxial relationship with a crystalline metal oxide (such as those that may be used to form the switching layer). For example, the material may be amorphous, such as amorphous $SiN_x$. As used herein, the term "epitaxial relationship" is used in its art-recognized sense to refer to a match in crystal lattice parameters and/or symmetry between different materials in a layer deposited on another layer. For example, the CMOS-compatible substrate, in contrast to a material such as sapphire (c-cut sapphire), may not have rotational (rotationally symmetric) lattice matching with a crystalline metal oxide in the switching layer that would be used to pattern a particular lattice structure in the switching layer.

The threshold switch device according to an embodiment of the present disclosure may include a first electrode and a second electrode. The positions and arrangement of the first electrode and the second electrode with respect to the substrate and to each other may be the same as described above with respect to the example embodiments of the MOM switches. In some embodiments, for example, the first electrode may be within a trench in the CMOS-compatible substrate, and the first electrode and CMOS-compatible substrate may be planarized.

The first and second electrodes are conductive, and may each independently be formed of a CMOS-compatible material. In some embodiments, for example, the first and second electrodes may be formed of an elemental metal, a metal alloy, a metal nitride, a metal silicide, a doped semiconductor material, or a mixture thereof. Non-limiting examples of suitable metals may include chromium (Cr), titanium (Ti), cobalt (Co), nickel (Ni), platinum (Pt), palladium (Pd), aluminum (Al), copper (Cu), molybdenum (Mo), tantalum (Ta), or tungsten (W). Non-limiting examples of suitable alloys may include alloys of any of the above metals (for example, TiW). Non-limiting examples of suitable metal nitrides may include nitride compounds of any of the above metals (such as TiN, TaN, and WN). Non-limiting examples of suitable metal silicides may include silicide compounds of any of the above metals (such as $TiSi_2$, $WSi_2$, $MoSi_2$, $TaSi_2$, NiSi, and $CoSi_2$). A non-limiting example of a suitable doped semiconductor material may include doped polysilicon (i.e., polycrystalline silicon).

The first and second electrodes may each independently have a single layer structure or a multi-layered structure. In some embodiments, at least one of the first and second electrodes may include one or more layers of Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon. In some embodiments, the electrode may be composed of multiple layers of metal. In some embodiments, the electrode may be composed of multiple layers of metal interspersed with multiple layers of a metal nitride, metal silicide, or doped semiconductor material. For example, the electrode may be composed of one or more layers of an interconnect metal including one of W, Al, or Cu, interposed with one or more layers of an interfacial material including one of a metal nitride, a metal silicide, and poly-Si.

The electrodes may typically have a length spanning at least one dimension of the device in a planar direction so that the electrode can be connected to other circuit components or devices. The height (e.g., thickness) and width (e.g., the measurement along the planar direction that is orthogonal to the length) of the each electrode is not particularly limited, and may vary from a few nanometers to tens of microns. In some embodiments, the width and height of each electrode may be substantially similar to each other, but embodiments of the present disclosure are not limited thereto. To the extent that the height and width of the electrodes may be favorably minimized or reduced, the height and width may be limited by the resolution of the lithography technique used to deposit the electrodes. In some embodiments, for example, the width and height of the electrode may be about 1 micron or less, about 100 nm or less, about 50 nm or less, or about 10 nm or less.

Furthermore, as discussed above, while the first electrode and the second electrode are illustrated in the drawings as rectangular prisms having a rectangular or square cross-sectional shape, embodiments of the present disclosure are not limited thereto, and each electrode may have a cross-sectional shape of, for example, a trapezoid, a thin film having a width much longer than its height, etc. The sizes (e.g., cross-sectional sizes) and cross-sectional shapes of the first electrode and of the second electrode may be substantially similar, or may be independently selected to be different from each other. In some embodiments, the electrodes may include end caps at the edge of the device, the end caps having wider dimensions and/or larger planar surface areas to increase the interfacial area and robustness of circuit connection points.

The threshold switch device according to an embodiment of the present disclosure may include a switching layer between the first electrode and the second electrode. The switching layer may provide a first contact with the first electrode and a second contact with the second electrode at least along a thickness direction (TD) overlap of the device between the first electrode and the second electrode, as described above. Furthermore, the switching layer may have a chemical structure that enables threshold switching, as will be described in more detail herein.

In some embodiments, the switching layer may be substantially composed of vanadium dioxide ($VO_2$). In some embodiments, the switching layer may consist essentially of vanadium dioxide ($VO_2$). In some embodiments, the switching layer may be formed of nearly pure vanadium dioxide ($VO_2$). In some embodiments, the switching layer may include (or essentially consist of) vanadium dioxide ($VO_2$) in an amount of greater than 90% purity, greater than 95% purity, greater than 98% purity, greater than 99% purity, or greater than 99.5% purity. For example, the switching layer may include only trace amounts (as that term is understood by those of ordinary skill in the art) of other materials (such as vanadium (III) oxide ($V_2O_3$), vanadium pentoxide ($V_2O_5$), Magnéli phases $V_nO_{2n-1}$ with $3 \leq n \leq 7$, Wadsley phases $V_{2n}O_{5n-2}$, other common vanadium-containing phases or compounds, and/or nonstoichiometric $VO_2$ phases) that may be considered impurities with respect to the $VO_2$ switching layer. For example, the switching layer may include such non-$VO_2$ impurities in an amount of less than 10%, less than 5%, less than 2%, less than 1%, or less than 0.5%. In some embodiments, the switching layer may substantially exclude vanadium pentoxide ($V_2O_5$) and other impurities, such as those described above.

In some embodiments, the $VO_2$ in the switching layer may have a low or minimal amount of non-stoichiometric phases. For example, in some embodiments, the $VO_2$ in the switching layer may have a stoichiometric V/O ratio of about 2.05 to about 1.95, for example, about 2.04 to about 1.94. The stoichiometric ratio may be measured using any suitable technique, such as secondary ion mass spectrometry (SIMS) or Rutherford back-scattering (RBS). Further, the presence of any non-stoichiometric phases may be inferred from the presence of peaks corresponding to such phases as seen in spectroscopic techniques including X-ray Diffraction (XRD), X-ray Absorption Spectroscopy (XAS), X-Ray Photoelectron Spectroscopy (XPS), etc.

In some embodiments, the $VO_2$ in the switching layer may be a substantially single crystalline thin film. In some embodiments, the $VO_2$ in the switching layer may take the form of a substantially continuous polycrystalline layer or film. Here, the term "substantially continuous" indicates that the crystals included in the layer or film are packed together so that the number and volume of any holes within the film are minimized or reduced.

In some embodiments, the switching layer (e.g., the $VO_2$ crystals in the switching layer) may have a monoclinic crystal lattice, a tetragonal (rutile-like) crystal lattice, or a mixture of both, and the crystals may transform between the monoclinic and tetragonal lattices according to the state of the device. For example, monoclinic $VO_2$ is a semiconductor (with a bandgap of about 0.6 V to about 0.7 V) and is the predominant (thermodynamically favored) phase below a transition temperature of about 67° C. or below a threshold voltage bias (as will be described in more detail below). The monoclinic phase of VO2 has $P_{21/c}$ space group crystal symmetry. Meanwhile, tetragonal $VO_2$ is metallic (conducting) and is the predominant (thermodynamically favored) phase above the transition temperature of about 67° C. or above a threshold voltage bias. The tetragonal phase has $P_{42/mnm}$ space group crystal symmetry. By comparison, vanadium pentoxide thin films are generally either amorphous or orthorhombic (with $P_{mmn}$ space group crystal symmetry).

Furthermore, as discussed above, the switching layer having a monoclinic crystal lattice, a tetragonal (rutile-like) crystal lattice, or a mixture of both may be deposited on a substrate that does not form an epitaxial relationship with the phases present in the switching layer, e.g., an amorphous substrate such as a CMOS-compatible substrate.

In some embodiments, a plurality of the $VO_2$ crystals in the switching layer may be columnar (e.g., have a columnar orientation) within the polycrystalline thin film. For example, the crystals may generally have a dimension (as described in a Cartesian coordinate system) that is longer than the other two, and the plurality of crystals may be aligned so that that longest dimension (e.g., the length axis) of each crystal is oriented substantially parallel to the thickness direction of the switching layer. Here, the term "substantially parallel" indicates that the crystal length axis is oriented closer to the thickness direction than the planar direction; for example, the azimuthal angle between the thickness direction and the crystal length axis may be about 0° to about 45°, about 0° to about 35°, about 0° to about 25, about 0° to about 15°, or about 0° to about 5°. Furthermore, in some embodiments, the percentage of crystals having this alignment may be greater than about 80% of the total number of crystals, greater than about 90%, greater than about 95%, or greater than 99% of the total number of crystals.

However, embodiments of the microstructure of the polycrystalline thin film and/or the morphology of the $VO_2$ crystals are not limited to the above, and may vary from process to process. In some embodiments, the longest dimensions of the plurality of the $VO_2$ crystals in the switching layer may be oriented along one or more axes that are not substantially parallel to the thickness direction of the switching layer. In some embodiments, for example, the longest dimensions of the crystals may be oriented along axes that are substantially perpendicular to the thickness direction of the switching layer. In some embodiments, the longest dimensions of the plurality of the $VO_2$ crystals in the switching layer may be randomly oriented; for example, the crystals may be aligned along a random distribution of axes, or may be mixed between a substantially parallel and a substantially perpendicular orientation (with respect to the thickness direction of the switching layer). Further, in some embodiments, the plurality of the $VO_2$ crystals in the switching layer may have a non-columnar morphology. For example, one or more of the plurality of the $VO_2$ crystals may have a substantially cubic shape or morphology.

The size of each $VO_2$ crystal may be determined or limited by the deposition method and parameters. In some embodiments, the length of each $VO_2$ crystal may be about 5 nm to about 500 nm, for example, about 10 nm to about 400 nm, about 15 nm to about 300 nm, about 20 nm to about 200 nm, about 25 nm to about 150 nm, about 30 nm to about 130 nm, about 35 nm to about 110 nm, about 40 nm to about 90 nm, etc. The remaining dimensions (diameters) of the crystals are not particularly limited as long as they are comparatively shorter.

The planar area of the switching layer is not particularly limited as long as a region of $VO_2$ is positioned within the crossing region, as described above. In some embodiments, the switching layer may have the same planar area as the CMOS-compatible substrate. The thickness of the switching layer may be determined or limited by the deposition method and parameters. As such, the thickness may range from a few nanometers to a few microns, although thinner films may be desired in some applications. In some embodiments, the thickness of the switching layer may be about 5 nm to about 500 nm; for example, about 10 nm to about 400 nm; about 15 nm to about 200 nm; about 20 nm to about 150 nm, about 30 nm to about 100 nm, or about 40 nm to about 80 nm.

In some embodiments, the plurality of columnar $VO_2$ crystals in the switching layer may be arranged so that they form multiple layers of packed crystals; that is, the switching layer may be formed of multiple layers of $VO_2$ crystals. In some embodiments, for example, the switching layer may include about 2 to about 6 layers, or about 3 to about 5 layers of $VO_2$ crystals. For example, the length of the $VO_2$ crystals may be about ⅓ to about ⅕ of the total thickness of the switching layer, corresponding to a length of about 20 nm to about 33 nm in a switching layer having a total thickness of about 100 nm. However, embodiments of the present disclosure are not limited thereto, and it will be understood that other crystal sizes (e.g., lengths) are possible.

In some embodiments, the plurality of columnar $VO_2$ crystals in the switching layer may be vertically continuous from a bottom edge to a top edge of the switching film (e.g., the polycrystalline thin film). For example, the plurality of columnar $VO_2$ crystals may be arranged so that they form a single layer of packed crystals; that is, the switching layer may be formed of a single layer of $VO_2$ crystals. Accordingly, in some embodiments, the switching layer may have a thickness less than about 150 nm, or less than about 100 nm.

The threshold switch device according to an embodiment of the present disclosure may include a dielectric layer on the first electrode and/or the CMOS-compatible substrate, where the dielectric layer defines a recess, and the switching layer is surrounded by the dielectric layer (e.g., in the planar direction) and is positioned within the recess. The dielectric layer may be formed of any CMOS-compatible dielectric material. In some embodiments, for example, the dielectric layer may be formed of $SiO_2$, $SiN_x$, $SiO_xN_y$, $Si_xN_yH_z$, SiCN, SiOF, SiCOH, porous SiCOH, phosphosilicate glass (PSG), borophosphosilicate glass (BSPG), borosilicate glass (BSG), or a mixture or combination thereof. In some embodiments, the dielectric layer may be formed of the same material as the CMOS-compatible substrate.

The thickness of the dielectric layer is not particularly limited as long as it has a thickness (height) that enables its upper surface to be flush or co-planar with the upper surface of the switching layer.

The CMOS-compatible substrate, electrodes, switching layer, and/or dielectric layer may be arranged or positioned according to any of the example embodiments described above.

The overall shape of the threshold switch device is not particularly limited, and may be selected for compatibility with the circuit or application of interest. In some embodiments, the threshold switch device may have the shape of a square or a rectangle. The overall size (e.g., scale) of the threshold switch device may be any suitable size required for packing and integration of the device into a circuit, but the lower bound may be limited by the resolution enabled by the deposition method and parameters.

The threshold switch device according to embodiments of the present disclosure may exhibit volatile resistive switching and current-controlled negative differential resistance from the first time a sweeping voltage or voltage pulse is applied across the device. For example, the threshold switch device according to embodiments of the present disclosure may be a non-electroformed device that does not need to be subjected to an electroforming current or process (such as an reducing current or process) to exhibit the volatile resistance switching. For example, the threshold switch device according to embodiments of the present disclosure may include a switching layer that substantially maintains the same atomic composition as initially deposited. The switching is independent of the voltage polarity (e.g., can occur under both positive and negative voltages). Here, the volatile resistance switching may be between a HRS at low (zero) bias and a LRS above a threshold voltage bias. The device may remain in the LRS as long as it is supplied with a holding current, and switch back to the HRS when the current drops below a minimum threshold value.

The threshold voltage bias may be determined by, for example, the size of the crossing region in the device (e.g., device area), the thickness of the switching film, and the resistivity of the switching film (e.g., the presence of any impurities, defects, etc.), and stress within the switching film introduced by the structural relationship between the switching film and the substrate (e.g., strain introduced by epitaxial relationship or lack thereof). The threshold voltage bias of the device may be designed or selected according to the requirements of the application and the design of the device. In some embodiments, the threshold voltage bias may be about ±0.8 V to about ±1.3 V. For example, when the crossing region is about 100 nm×about 100 nm, the threshold voltage bias may be about ±0.6 V to about ±1.2 V, and when the crossing region is about 50 nm×about 50 nm, the threshold voltage bias may be about ±0.8 V to about ±1.3 V. However, embodiments of the present disclosure are not limited thereto, and for example, the threshold voltage bias of the device may be lower than in the Examples.

The resistance values of the device when in the high resistance state (HRS) and the low resistance state (LRS) may also depend on the size of the crossing region in the device (e.g., device area), the thickness of the switching film, and the resistivity of the switching film (e.g., the presence of any impurities, defects, etc.). The HRS and LRS resistances of the device may be designed or selected according to the requirements of the application. For example, in some applications (such as low-power neuromorphic hardware, low-power RF switches, oscillators, etc.), it is desirable to have a HRS resistance that is as large as possible in order to reduce standby power dissipation. In some applications (e.g. RF switches), it is desirable to have a LRS resistance that is as low or close to zero as possible when the $VO_2$ switch is "on" (closed) in order to reduce insertion losses.

Further, the threshold switch device may repeatedly show the same volatile resistance switching and NDR behavior in repeated voltage sweeps and/or pulses. For example, the threshold switch device may have substantially identical switching characteristics over at least $10^3$, or in some embodiments, $10^6$ switching operations between a HRS and a LRS. In some embodiments, for example, the volatile resistance switching and NDR behavior may be consistently repeated (may exhibit endurance or high consistency) over more than about $10^6$ switching operations, more than about $10^8$ switching operations, more than about $10^{12}$ switching operations, or more than about $10^{14}$ switching operations. For example, the threshold voltage bias may not change more than the above percentage during its lifetime. The endurance and consistency of the switching device may be affected by the purity (e.g., compositional, phase, and structural homogeneity) of the switching thin film, and it will be understood that the endurance of the device and the level of spreading is closely tied to these characteristics. The endurance characteristics of the device may be designed or selected according to the requirements of the application.

According to embodiments of the present disclosure, a wafer composed of a complementary metal-oxide-semiconductor (CMOS)-compatible substrate includes a plurality of the above-described threshold switch devices. For example, each of the threshold switch devices may include: a first electrode on the CMOS-compatible substrate, the first electrode extending along a first direction; a second electrode on the first electrode, the second electrode extending along a second direction crossing the first direction; and a switching layer between the first electrode and the second electrode, the switching layer providing a first contact with the first electrode and a second contact with the second electrode at least along a thickness direction (TD) overlap of the device between the first electrode and the second electrode; the switching layer being composed substantially of vanadium dioxide having a thermodynamically driven metal-insulator transition. The parameters and characteristics of the components included in each threshold switch device may be the same as described above, and the arrangement of the components in each threshold switch device may also be the same as described above.

The arrangement of the plurality of threshold switch devices with respect to each other on the wafer is not particularly limited, and may be selected according to the desired circuit, as needed for the wafer application. In some embodiments, the plurality of threshold switch devices may be arranged in an array.

The switching behavior of each of the plurality of threshold switch devices on the wafer may be the same as described above. Furthermore, the plurality of threshold switch devices may have a variation of switching characteristics of less than about 25%, and in some embodiments, less than about 20%, less than about 15%, or less than about 10%. Here, the term "variation of switching characteristics" refers to descriptive statistical quantities acquired from multiple copies of the threshold switch device according to an embodiment of the present disclosure, which are formed in a similar fashion to exhibit substantially similar switching behaviors and parameters. The variation may be described as the spreading in a measured switching characteristic (e.g. the spreading in the threshold voltage), which can be quantitatively calculated by taking the full width at half maximum (FWHM) of a histogram of all the measured values, then normalizing the value by dividing the FWHM by the mean of all the measured values. In some embodiments, for example, the threshold voltage $V_T$ spreading may be less than about 25%, less than about 20%, less than about 15%, or less than about 10%.

The threshold switch devices may be formed on the wafer with a high yield. Here, the term "yield" may refer to the proportion or percentage of devices that are able to function according to the performance parameters described above, for example with respect to the threshold voltage, consistency with respect to switching operations, and uniformity. In some embodiments, for example, the yield may be about 80% or higher, about 90% or higher, about 95% or higher, or about 97% or higher. For example, the yield of more than 500 devices on the same wafer may be about 98%.

According to embodiments of the present disclosure, an electrical relaxation oscillator or electrical oscillating circuit is based on, and includes the threshold switch device according to embodiments of the present disclosure. In some embodiments, the relaxation oscillator may be a Pearson-Anson relaxation oscillator, and may be used as a functional building block to construct spiking neuron circuitries, as described in U.S. patent application Ser. No. 15/976,687, filed May 10, 2018 and titled "Scalable Excitatory and Inhibitory Neuron Circuitry Based on Vanadium Dioxide Relaxation Oscillators", the entire content of which is incorporated herein by reference.

In some embodiments, the electrical oscillator may be a regenerative switching circuit (i.e., an astable multivibrator) that continually oscillates between two states to producing sawtooth output waveforms. The electrical oscillator may not have stable output states at any given time. In contrast to monostable and bistable multivibrators, the astable multivibrator may not require an external assistance (e.g., a trigger pulse) for operation, and may instead include a built-in triggering mechanism that automatically and continuously triggers the switching behavior. The built-in triggering mechanism may be a thermodynamically-driven Mott transition in the threshold switch.

In some embodiments, the electrical oscillator may include the threshold switch device; a load resistor connected in series with the threshold switch device; a reactive circuit element connected in parallel with the threshold switch device; and a DC voltage supply, wherein the oscillation frequency of the electrical oscillator circuit can be controlled by adjusting the DC voltage, adjusting the value of the load resistor, and/or adjusting the value of the reactive circuit element.

In some embodiments, the reactive circuit element may be selected from a capacitor and an inductor. In some embodiments, the reactive circuit element may be a capacitor and the oscillation frequency of the electrical oscillator circuit can be controlled by adjusting the capacitance.

Figure 8A:
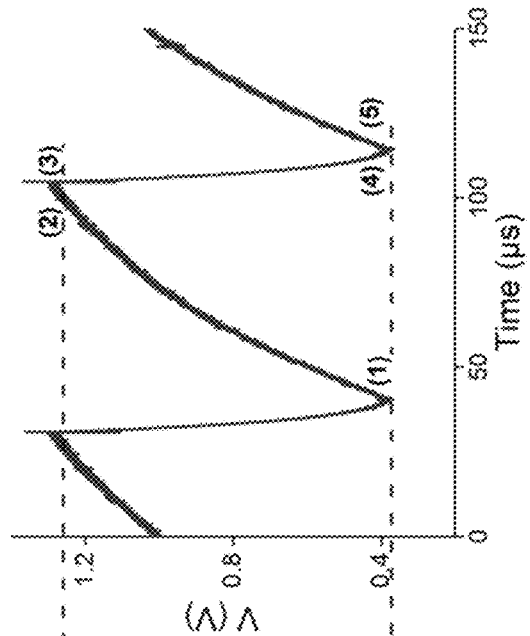
FIGS. 8A-8D describe the behavior of an example astable Pearson-Anson relaxation oscillator circuit including a vanadium dioxide ($VO_2$) threshold switch device, according to embodiments of the present disclosure.
Figure 8C:
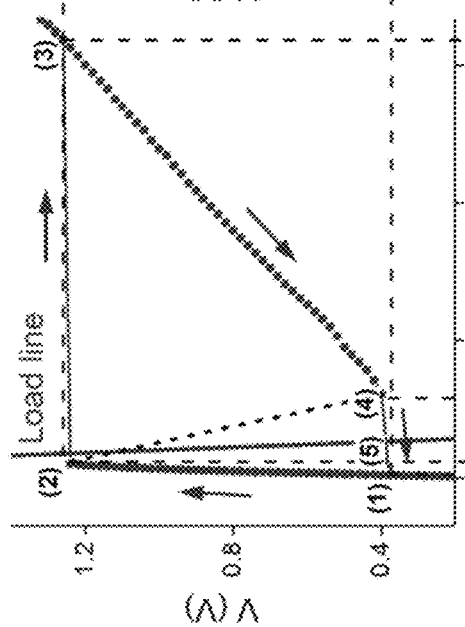
Figure 8B:
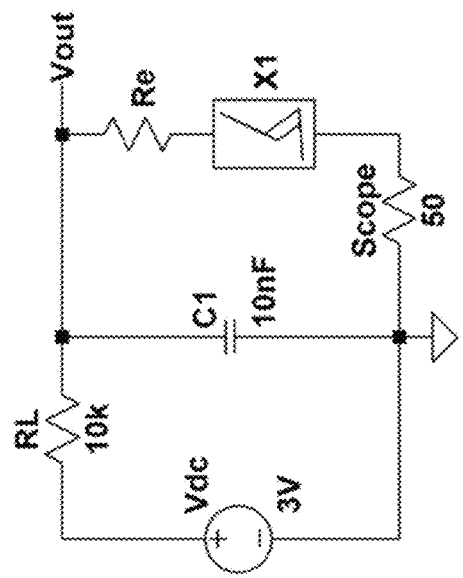
Figure 8D:
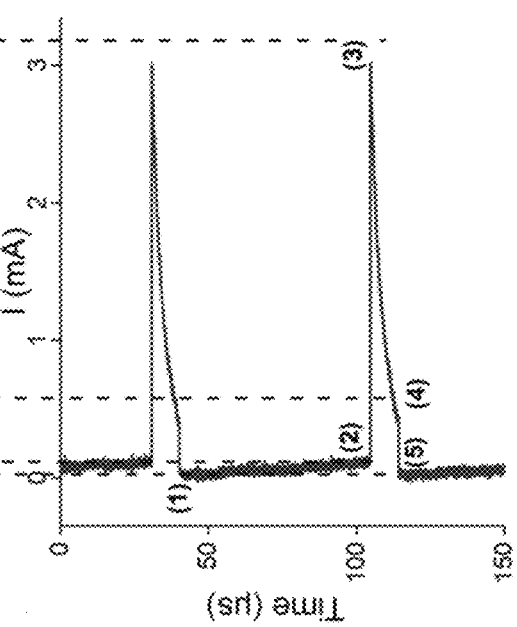

FIGS. 8A-8D describe the behavior of an example astable Pearson-Anson relaxation oscillator circuit including a vanadium dioxide ($VO_2$) threshold switch device, according to embodiments of the present disclosure. FIG. 8D is a circuit diagram for an astable Pearson-Anson relaxation oscillator circuit (producing an oscillating voltage) including a $VO_2$ threshold switch device ($X_1$) in series with a parasitic series resistor $R_e$ (having a value of 370Ω in this example) that models the resistance of metal electrodes in the crossbar switching device. The current flowing through $X_1$ is drained to ground through the 50Ω input resistance of an oscilloscope channel used to monitor the current signal. The oscillator output voltage ($V_{out}$) is monitored by a second oscilloscope channel with high input impedance (10 MΩ). A load resistor ($R_L$) is connected in series with the threshold switch device $X_1$; a capacitor ($C_1$) is connected in parallel with the threshold switch device $X_1$; and a DC voltage supply ($V_{dc}$) is connected between $R_L$ and ground (3 V was used for the example data shown).

FIG. 8A is an I-V plot showing the quasi-DC V-I characteristics of the $VO_2$ device ($X_1$) in the circuit of FIG. 8D upon sweeping the DC bias from about 0 V to about 1.6 V and then back to 0 V. Only a portion of the V-I characteristics, in the DC bias range from 0 V to 1.4 V, is displayed for clarity. The term "quasi-DC" indicates that the voltage applied across the device-under-test (DUT) is varied at a much slower rate than the rate of voltage change caused by the internal switching dynamics of the DUT. This contrasts with dynamic tests, which typically involve fast voltage pulses. In FIG. 8A, the voltage was measured using a 2-terminal method, and the voltage value of each data point reflects the total voltage drop across the oxide switching layer and the metal electrodes. Astable oscillations are enabled when the load line (solid line sloping upward from about 0.3 V, which is determined by the DC bias ($V_{dc}$) of 3 V and the load resistor ($R_L$) of 10 kΩ in the circuit of FIG. 8D) intersects the V-I curve in its negative resistance region (denoted by the dashed line connecting (2) and (4)).

FIG. 8B is a waveform diagram showing the output voltage ($V_{out}$) with respect to time in the circuit of FIG. 8D. In particular, a series of sawtooth-shaped relaxation oscillations are produced by the circuit. The dashed lines between FIGS. 8A and 8B show the one-to-one correspondences between the Mott transitions from (2) to (3) and from (4) to (5) in FIG. 8A and the voltage maxima and minima of the oscillation waveform in FIG. 8B.

FIG. 8C is a waveform diagram, rotated clockwise by 90 degrees to align with FIG. 8A, showing the current flowing through the $VO_2$ device $X_1$ as a function of time, as monitored by an oscilloscope channel with 50Ω input resistance to ground ("Scope 50" in FIG. 8D). The abrupt increases and decreases in current (e.g., from (2) to (3) and from (4) to (5)) correspond to Mott transition events within the device $X_1$. The dashed lines between FIGS. 8A and 8C shows the one-to-one correspondences between the Mott transitions from (2) to (3) and from (4) to (5) in FIG. 8A and the same Mott transition events in FIG. 8C. The actual rise/fall time in the Mott transitions during (2)-(3) and (4)-(5) are much shorter than the oscilloscope sample interval used (2 ns) and thus cannot be measured in this setup.

In FIGS. 8A-8D, a complete astable oscillation cycle between states (1) to (5) occurs in four stages (see arrows in FIG. 8A, marking the transitions between states; note that identical number labels in plots a to c are each referring to the same state). In the transition from stage (1) to (2), the switch $X_1$ remains open (e.g., in a HRS), such that the capacitor $C_1$ is charged until $V_{out}$ reaches the switching threshold of $X_1$. In the transition from stage (2) to (3): the switch $X_1$ is closed (i.e., switches to a LRS), causing a surge in current. However, $V_{out}$ is held constant by $C_1$. In the transition from stage (3) to (4), the capacitor $C_1$ is discharged until $V_{out}$ falls below the minimum holding voltage for $X_1$ to stay in a metallic LRS. In the transition from stage (4) to (5): $X_1$ is reopened (i.e., returns to a HRS). As long as the DC bias is maintained, the circuit in FIG. 8D is regenerative, and the astable oscillation cycle between states (1) to (5) repeats spontaneously, thereby producing a continuous train of sawtooth output waveforms. However, embodiments of the present disclosure are not limited thereto.

According to embodiments of the present disclosure, a method of manufacturing a threshold switch device includes: providing a complementary metal-oxide-semiconductor (CMOS)-compatible substrate; depositing a first electrode on the CMOS-compatible substrate to extend along a first direction; depositing a switching layer composed substantially of polycrystalline vanadium dioxide in a thin film over the first electrode; and depositing a second electrode over the switching layer to extend along a second direction crossing the first direction. The switching layer may have a first contact with the first electrode and a second contact with the second electrode at least along a thickness direction (TD) overlap of the device between the first electrode and the second electrode. The threshold switch device is not subjected to an electroforming process; that is, the method of manufacturing the threshold switch device does not include electroforming. The threshold switching device may exhibit volatile resistance switching and current-controlled negative differential resistance from the first time a sweeping voltage or voltage pulse is applied across the device.

The CMOS-compatible substrate may be the same as described above. In some embodiments, the CMOS-compatible substrate may be provided in the form of a wafer, and a plurality of threshold switch devices may be formed thereon.

The first and second electrodes may be deposited using any suitable technique available in the art. In some embodiments, for example when the electrodes are formed of metal, the electrodes may be formed using a lithography technique, an etching technique, an electroplating technique, or a vapor deposition technique. In some embodiments, when the first electrode is deposited within a trench in the CMOS-compatible substrate, the trench within the substrate may be formed by etching.

The switching layer may be deposited using physical vapor deposition (PVD). In some embodiments, the switching layer may be deposited using a reactive DC or RF magnetron sputtering method. In some embodiments, the deposition may be carried out using a vanadium oxide and/or vanadium metal target under a reactive gas mixture of Ar and $O_2$. During the deposition, the CMOS-compatible substrate may be maintained at an elevated temperature significantly above room temperature, and may rotate around its thickness direction (TD) at certain rotational speed. The thin film may include or be composed of nanocrystals that are columnar and vertically continuous from a bottom edge to a top edge of the thin film In some embodiments, the method of manufacturing a threshold switch device may further include depositing a dielectric layer so that the dielectric layer defines a recess, and the switching layer is surrounded by the dielectric layer (e.g., in the planar direction) and is positioned within the recess. In some embodiments, the dielectric layer may be deposited over the device after the process of depositing a first electrode on the CMOS-compatible substrate to extend along a first direction. Subsequently, a recess may be formed in the dielectric layer to provide a space for the switching layer. In some embodiments, the recess may be formed by etching. In some embodiments, the recess may be formed by using a mask to prevent or reduce deposition of the dielectric material on the area covered by the mask, followed by removing the mask.

The following examples and experimental data are provided for illustrative purposes only, and do not limit the scope of the embodiments of the present invention.

Example 1

A polycrystalline $VO_2$ thin film was deposited on a $SiN_x/Si$ CMOS-compatible substrate using a vanadium oxide target in a commercial DC & RF magnetron sputter system. The $VO_2$ thin film was characterized using X-ray diffraction, secondary-ion mass spectrometry, Rutherford backscattering spectroscopy, X-ray photoelectron spectroscopy, transmission electron microscopy, and selected area electron diffraction.

Figure 9A:
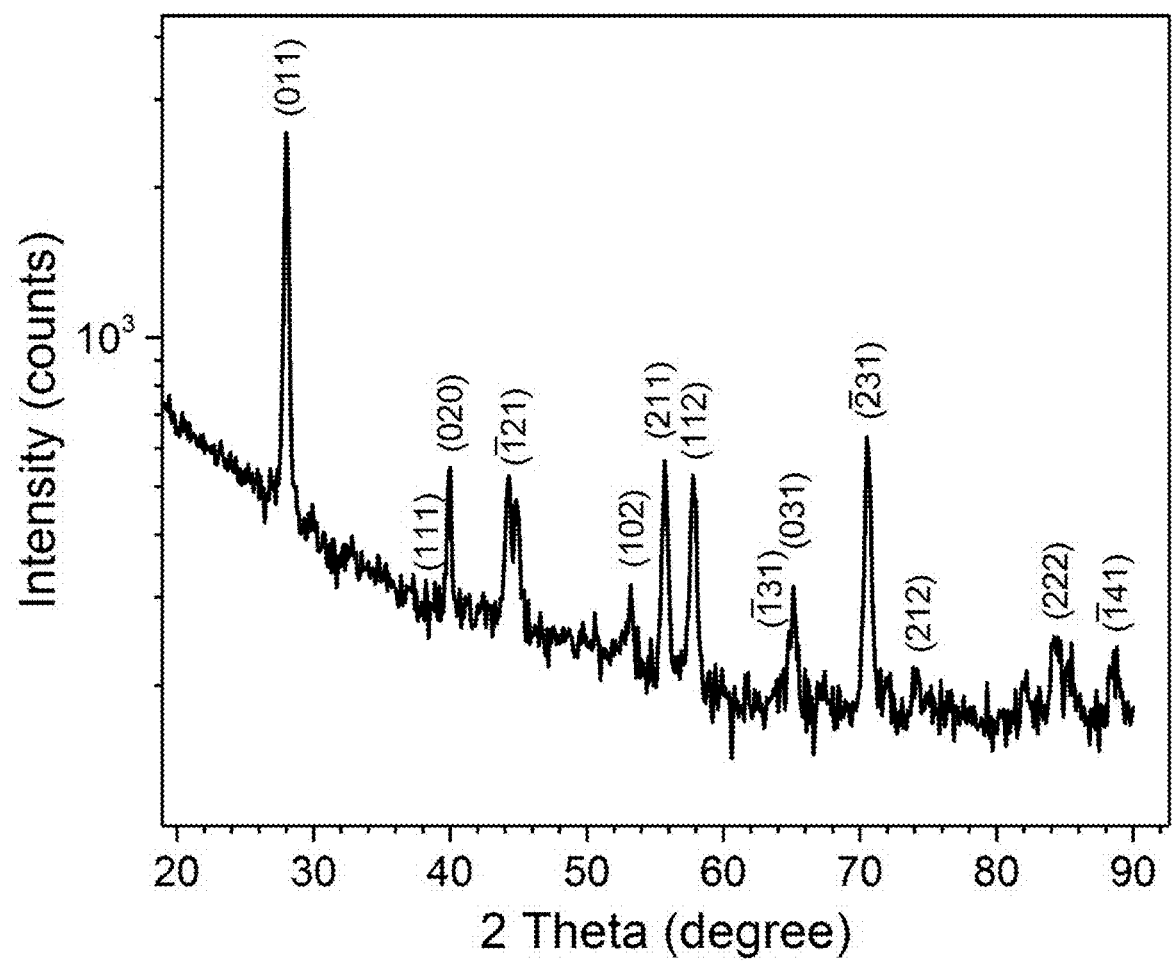
FIG. 9A is a grazing incidence X-ray diffraction (GIXRD) spectrum of the $VO_2$ thin film of Example 1 between a 2θ range of about 20° to about 90°.

FIG. 9A is a grazing incidence X-ray diffraction (GIXRD) spectrum of the $VO_2$ thin film of Example 1 between a 2θ range of about 20° to about 90°. The indexed peaks (e.g., at about 28°, 40°, 44°, etc.) correspond to the results of a phase-identification analysis using whole pattern fitting (WPF) method. The best match is found with a monoclinic $VO_2$ phase (space group: $P_{2_1/c}$ (14), PDF#98-001-4290).

Figure 9B:
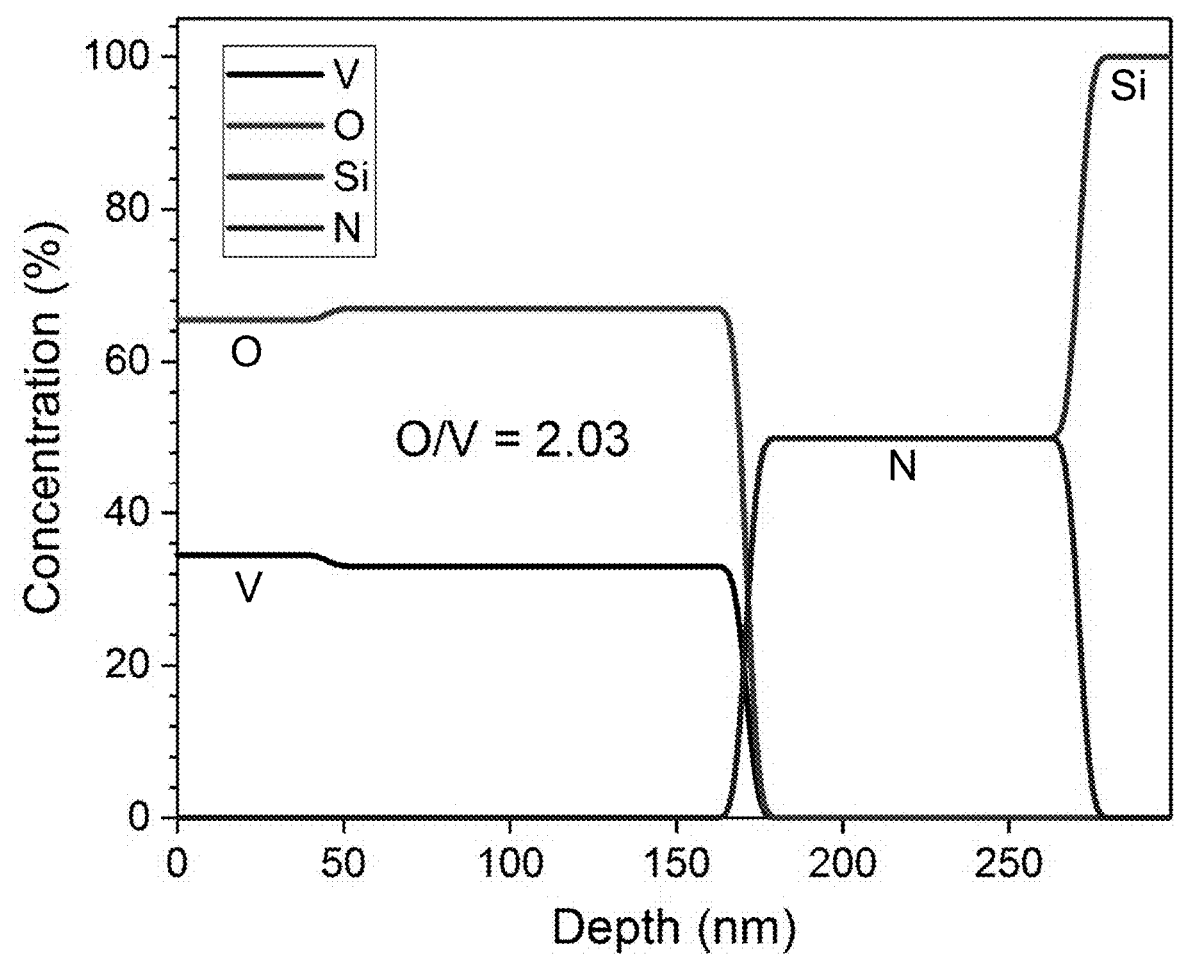
FIG. 9B is a Rutherford backscattering spectrometry (RBS) spectrum of the $VO_2$ thin film of Example 1, showing the atomic concentrations of elements silicon (Si), vanadium (V), oxygen (O), and nitrogen (N) with respect to the depth (i.e., distance from the surface) of the sample.

FIG. 9B is a Rutherford backscattering spectrometry (RBS) of the $VO_2$ thin film of Example 1, showing the atomic concentrations of elements Si, V, O, and N with respect to the depth (e.g., distance from the surface) of the sample. The O:V stoichiometric ratio at a depth of about 40 nm to about 150 nm was found to be about 2.03:1, which is consistent with the expected ratio of about 2:1 for the $VO_2$ phase and suggests a high level of purity (e.g., a low concentration of other vanadium oxide compounds and non-stoichiometric phases). The $SiN_x$ layer below the $VO_2$ film can be observed at a depth of about 170 nm to about 270 nm, and the underlying Si layer can be seen at a depth of greater than about 270 nm. The thickness in RBS was estimated by assuming a density of about $7.15 \times 10^{22}$ atoms/$cm^3$.

Figure 9C:
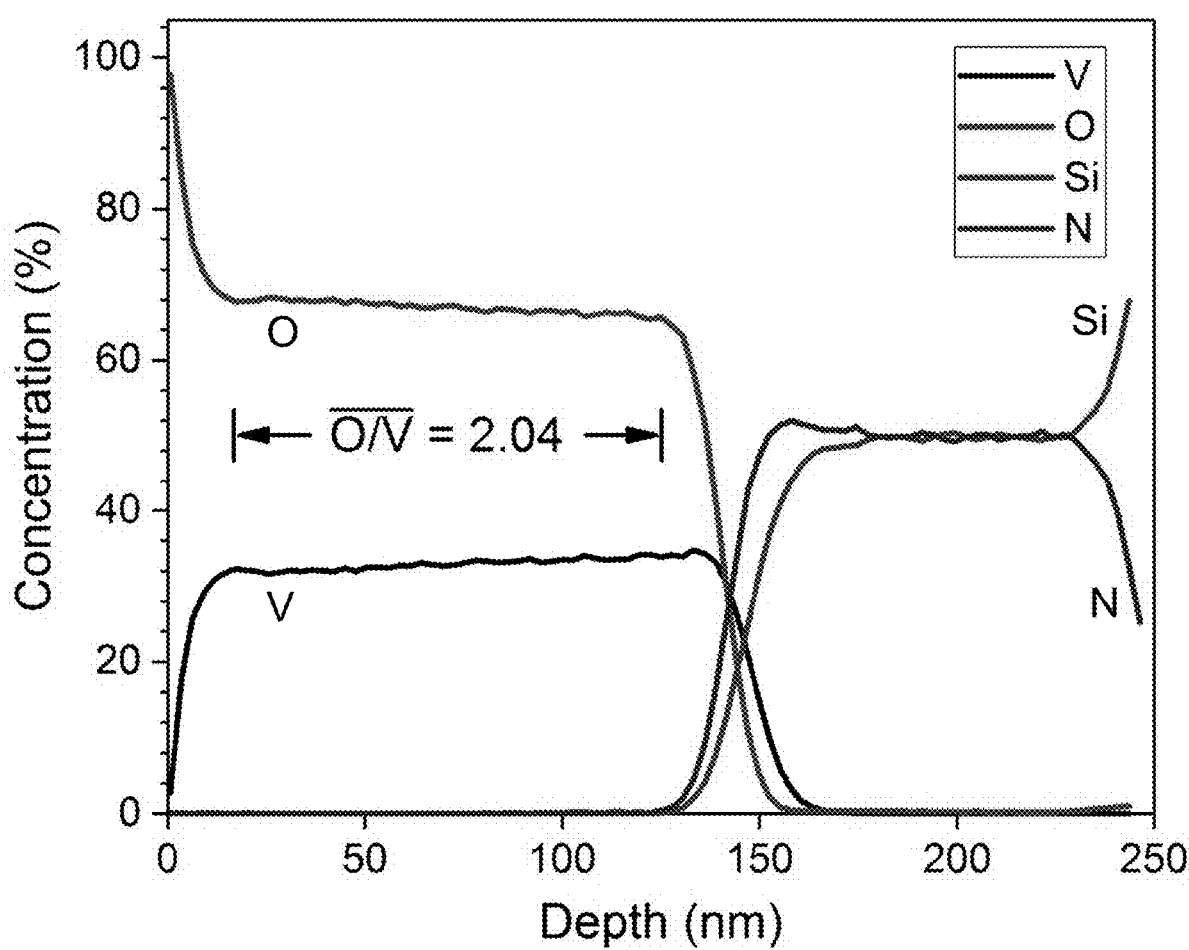
FIG. 9C is a secondary ion mass spectrometry (SIMS) spectrum of the $VO_2$ thin film of Example 1, showing the concentrations of elements Si, V, O, and N with respect to the depth (i.e., distance from the surface) of the sample.

FIG. 9C is a secondary ion mass spectrometry (SIMS) of the $VO_2$ thin film of Example 1, showing the concentrations of elements Si, V, O, and N with respect to the depth (e.g., distance from the surface) of the sample. The O:V ratio was found to be about 2.04, which is consistent with the expected ratio of about 2:1 for the $VO_2$ phase and suggests a high level of purity (e.g., a low concentration of other vanadium oxide compounds and non-stoichiometric phases).

Figure 9D:
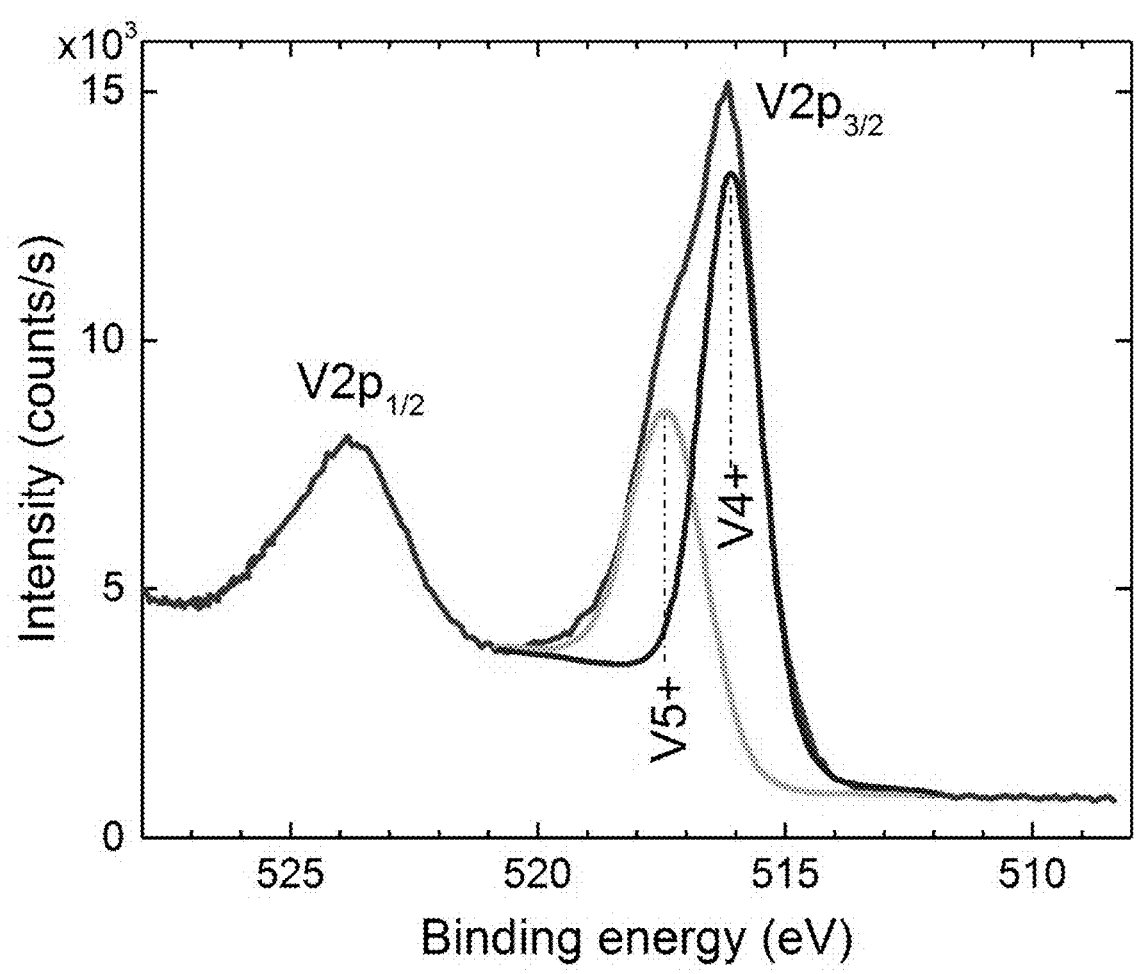
FIG. 9D is an X-ray photoelectron spectroscopy (XPS) core level spectrum of the top surface of the $VO_2$ thin film of Example 1, centered around the V2p spectral doublet ($V2p_{1/2}$ and $V2p_{3/2}$).

FIG. 9D is an X-ray photoelectron spectroscopy (XPS) core level spectrum of the top surface of the $VO_2$ thin film of Example 1, centered around the V2p spectral doublet ($V2p_{1/2}$ and $V2p_{3/2}$). The $V2p_{3/2}$ peak is curve fitted to quantify the oxidation states of V, and shows that about 64% of the vanadium is in a $V^{4+}$ oxidation state, with the about 36% remainder being at a $V^{5+}$ state. As XPS probes the top few nanometers of a sample, the detected $V^{5+}$ state is likely caused by post-deposition oxidation after exposure to air.

Figure 10A:
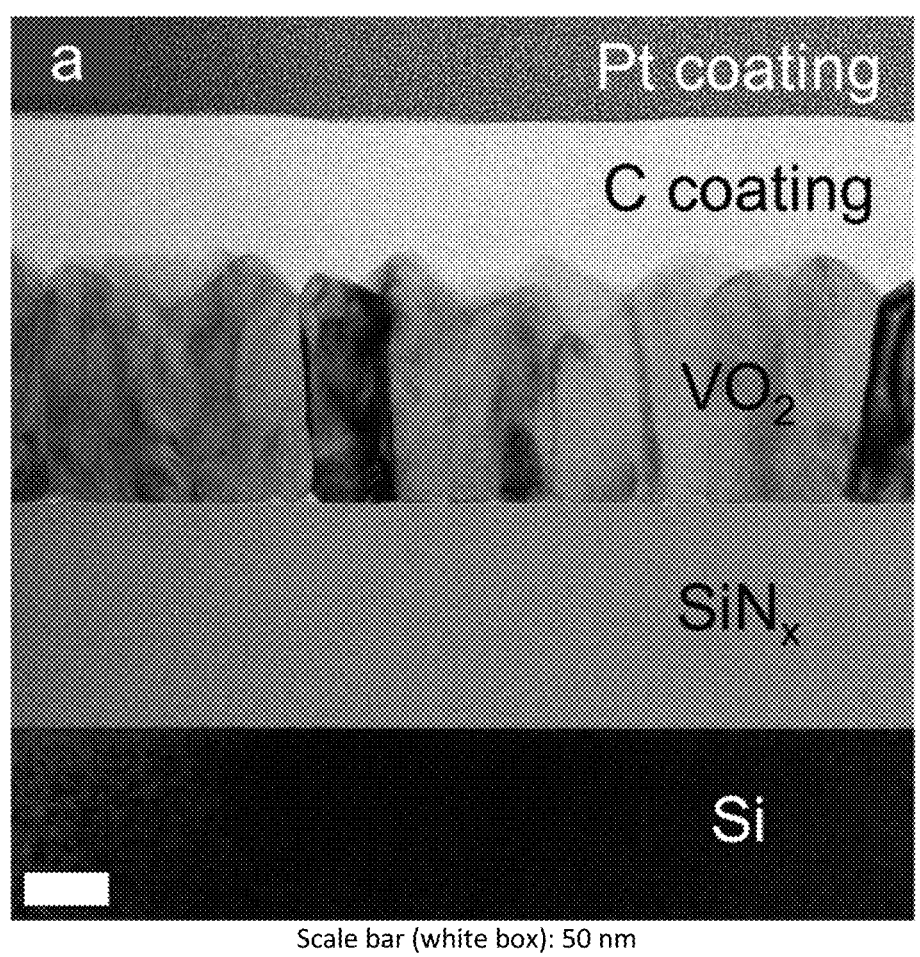
FIG. 10A is a cross-sectional bright-field transmission electron microscopy (BFTEM) image of the $VO_2$ thin film of Example 1, prepared by focused ion beam cutting.
Figure 10B:
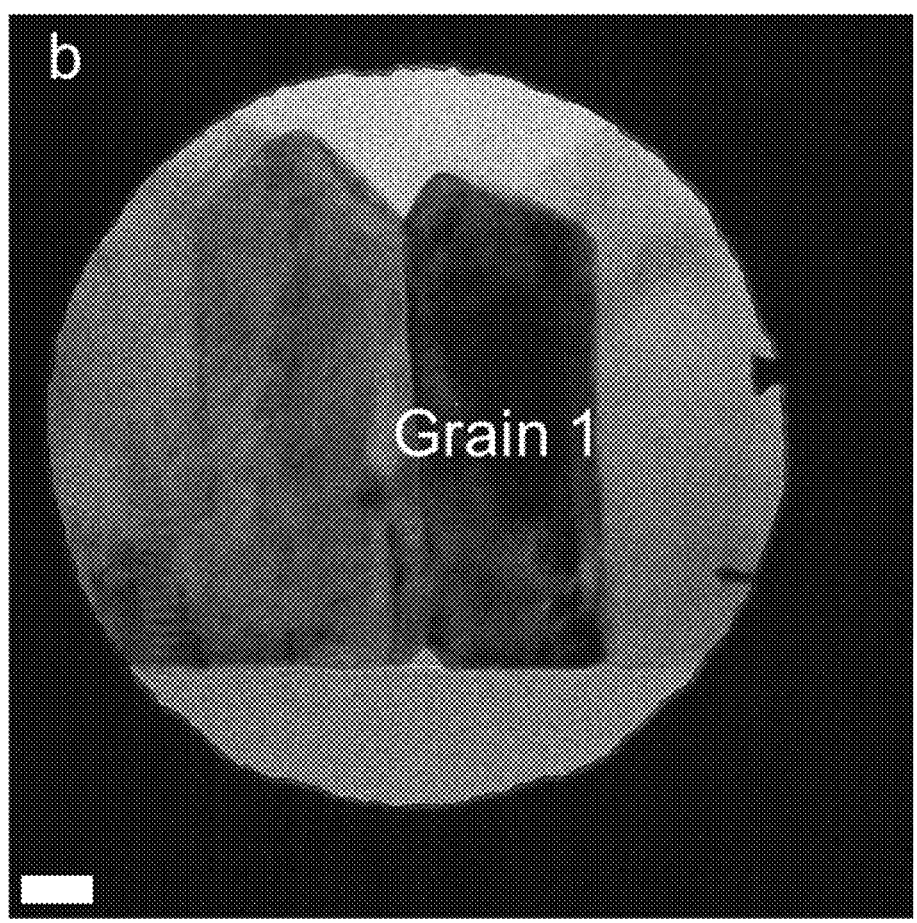
FIG. 10B is a close-up BFTEM image of a single grain ("Grain 1") in the polycrystalline $VO_2$ thin film of Example 1.
Figure 10C:
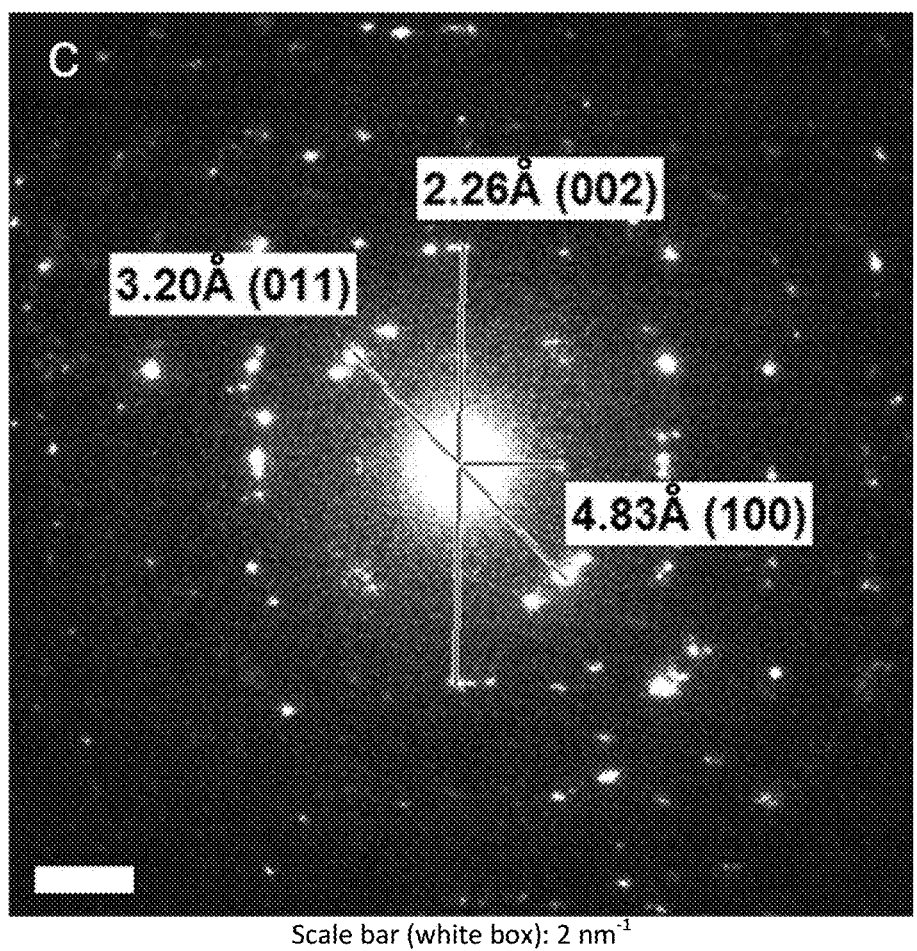
FIG. 10C is a selected area electron diffraction (SAED) pattern of Grain 1 in FIG. 10B.

FIG. 10A is cross-sectional bright-field transmission electron microscopy (BF-TEM) image of the $VO_2$ thin film of Example 1, prepared by focused ion beam (FIB) cutting and showing the stacked arrangement of the Si substrate layer, $SiN_x$ substrate layer, polycrystalline $VO_2$ thin film, C coating layer, and Pt coating layer. The coating layers of carbon (C) and platinum (Pt) were deposited on the polycrystalline $VO_2$ thin film of Example 1 prior to FIB cutting as part of the sample preparation procedure. The polycrystalline, columnar structure of the $VO_2$ film is clearly resolved. The brighter and darker contrasts seen across grain boundaries between crystal grains are caused by electron beam diffraction through lattice planes with a slight tilt from one grain to another. FIG. 10B is a close-up BF-TEM image focusing on a single $VO_2$ crystal grain ("Grain 1") in the polycrystalline $VO_2$ thin film of Example 1. FIG. 10C is a selected area electron diffraction (SAED) pattern of Grain 1 in FIG. 10B. The diffraction spots can be matched with the d-spacing of the (002), (100), and (011) lattice planes of the monoclinic $VO_2$ phase (space group: $P_{21/c}$ (14), PDF#98-001-4290).

As such, the film morphology, crystal structure, and chemical composition of a $VO_2$ thin film deposited on a $SiN_x$/Si CMOS-compatible substrate according to embodiments of the present disclosure was confirmed.

Example 2

A plurality of electronic threshold switch devices including a $VO_2$ thin film were fabricated on a 3-inch $SiN_x$/Si CMOS-compatible substrate wafer using the same process used in Example 1.

Figure 11C:
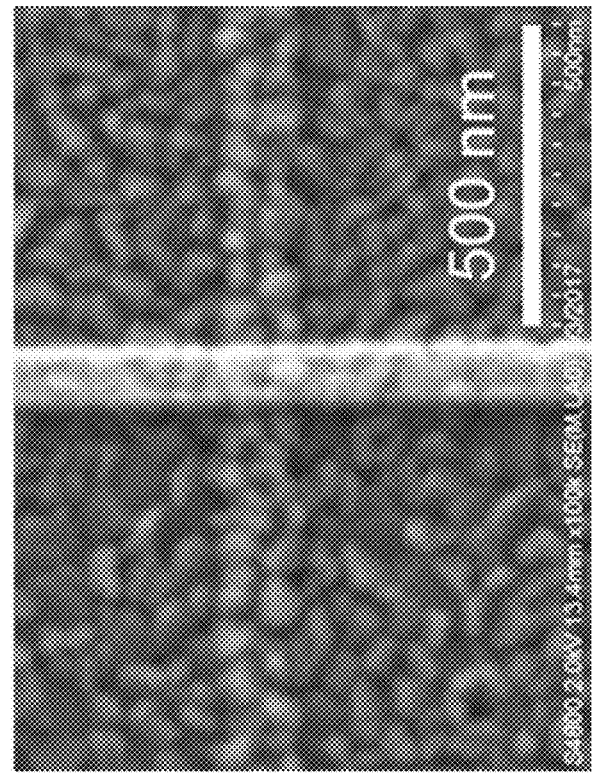
FIGS. 11B and 11C are scanning electron microscopy (SEM) images showing a top (plan) view of the central regions of even-numbered 50 nm×50 nm and the odd-numbered 100 nm×100 nm $VO_2$ devices, respectively.
Figure 11B:
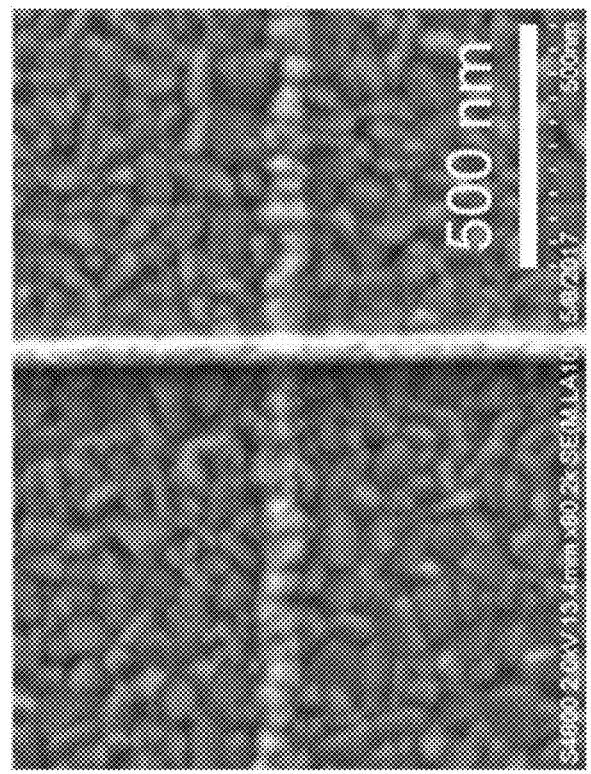

FIG. 11A is a photographic image of the completed wafer of Example 2, which includes 36 reticles arranged in a six-row (row 48 to row 53) and six-column (column 48 to column 53) (6×6) array. 16 $VO_2$ threshold switch devices array (numbered as device 1 to device 16) arranged in a four-row and four-column (4×4) array are fabricated within each reticle, for a total number of 576 devices on the same wafer. The devices were produced in two sizes, with even-numbered devices (devices D2, D4, D6, D8, D10, D12, D14, and D16) having a crossing region size of about 50 nm×about 50 nm, and odd-numbered devices (devices D1, D3, D5, D7, D9, D11, D13, and D15) having a crossing region size of about 100 nm×about 100 nm. FIGS. 11B and 11C are SEM images showing a top (plan) view of the even-numbered 50 nm×50 nm and the odd-numbered 100 nm×100 nm devices, respectively. The granular and polycrystalline morphology of the $VO_2$ film in each is clearly resolved.

Figure 12:
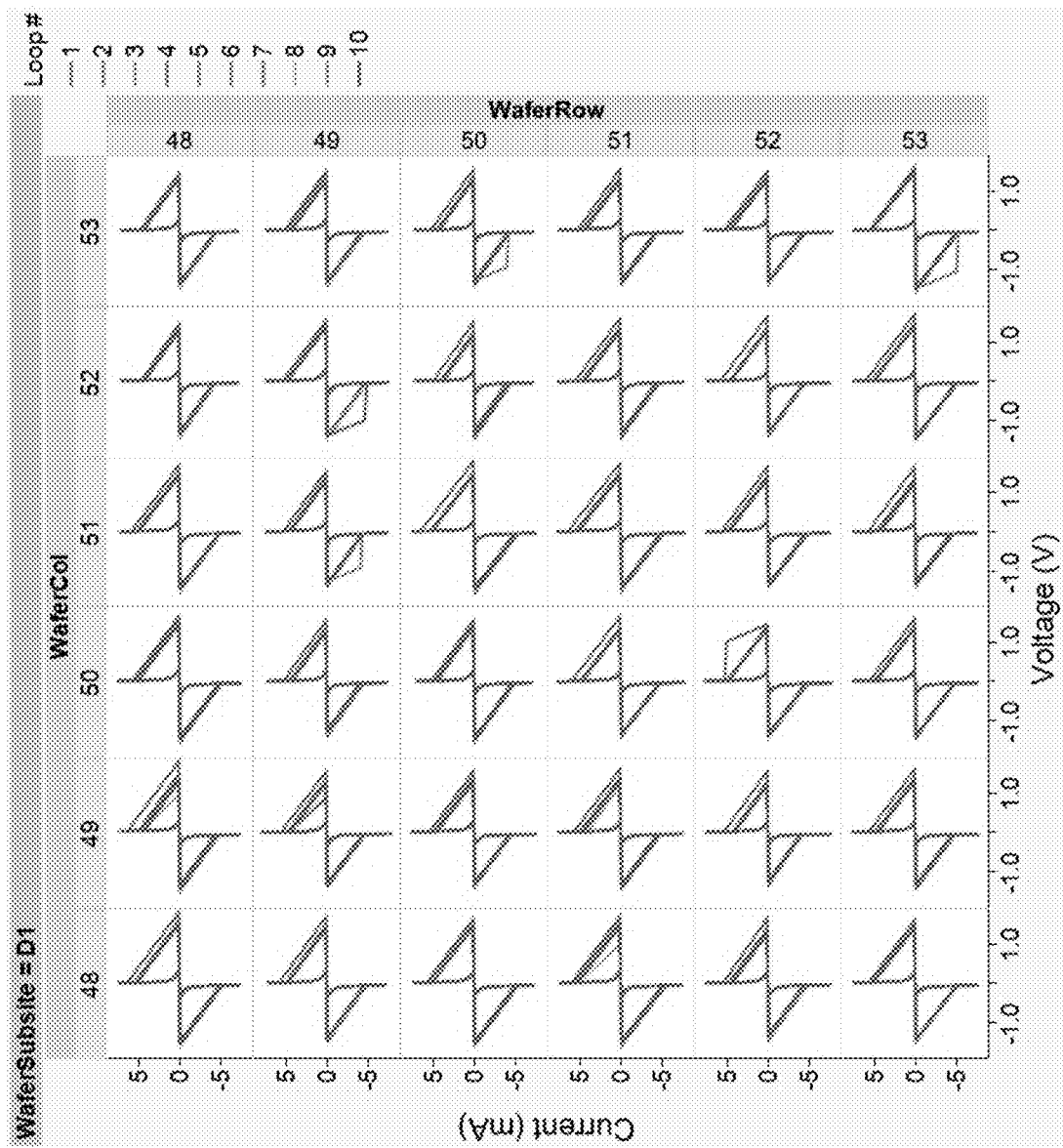
FIG. 12 shows the experimentally measured first ten iterations of I-V plots under both positive and negative voltage polarities for each of the first (odd-numbered) 100 nm×100 nm devices located in each reticle in the wafer of Example 2.

I-V plots under both positive and negative voltage polarities were measured on all the 576 devices fabricated on the same wafer. As an example, FIG. 12 shows the I-V plots collected from the 36 copies of the first odd-numbered 100 nm×100 nm devices (device D1) located in each reticle in the wafer of Example 2, repeated 10 times for each device. In these plots, the voltage was measured using a 4-terminal method, with two extra voltage probes connected to the non-current-carrying arms of the crossbar device to monitor the voltage drop across the oxide junction in order to clearly observe the resistance values of the $VO_2$ device in the LRS and HRS. As such, the voltage value of each data point reflects the voltage drop across the oxide switching layer only. The consistent plot shapes confirm that each device started NDR switching in the very first I-V sweep without the need of any electroforming process. Furthermore, the similarities between the initial and subsequent I-V sweeps demonstrate that each device was capable of nearly identical switching characteristics over the 10 measured cycles, as well as with respect to each other. The difference in the shape of the I-V traces in FIG. 12 from the shape of I-V traces in FIG. 2 and FIG. 8A reflects the different measurement methods (4-terminal method versus 2-terminal method).

Figure 13A:
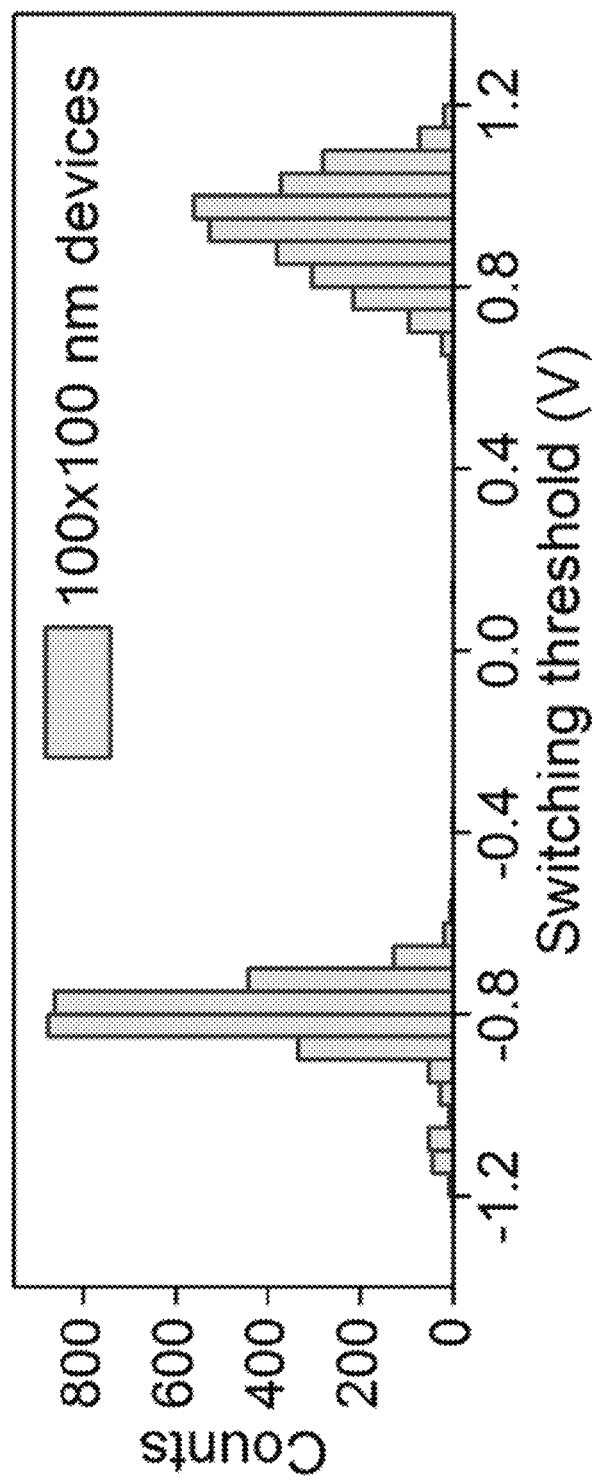
FIGS. 13A and 13B are histograms of the negative differential resistance (NDR) switching voltage thresholds under positive (right side) and negative (left side) voltage polarities for the odd-numbered $VO_2$ devices with a size of 100 nm×100 nm and the even-numbered devices with a size of 50 nm×50 nm, respectively, on the wafer of Example 2.
Figure 13B:
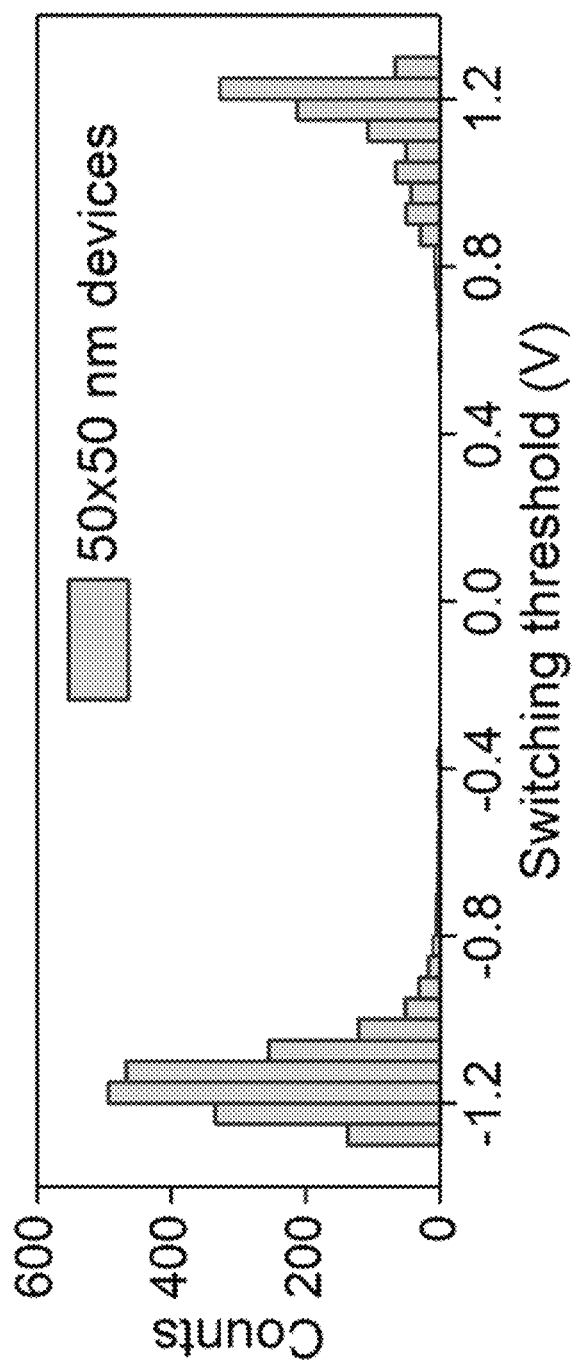

FIGS. 13A and 13B are histograms of the NDR switching voltage thresholds under positive (right side) and negative (left side) voltage polarities for the odd-numbered $VO_2$ devices with a size of about 100 nm×about 100 nm and the even-numbered devices with a size of about 50 nm×about 50 nm, respectively, on the wafer of Example 2. Under positive voltage polarity, the 100 nm×100 nm devices were found to have a voltage switching threshold of about ±0.6 V to about ±1.2 V, and the 50 nm×50 nm devices were found to have a voltage switching threshold of about ±0.8 V to about ±1.3 V. The spreading in switching threshold voltage was found to be about 25% or less, as calculated from dividing the FWHM (full width at half maximum) in the histograms of the switching thresholds by the mean of the thresholds.

Figure 14:
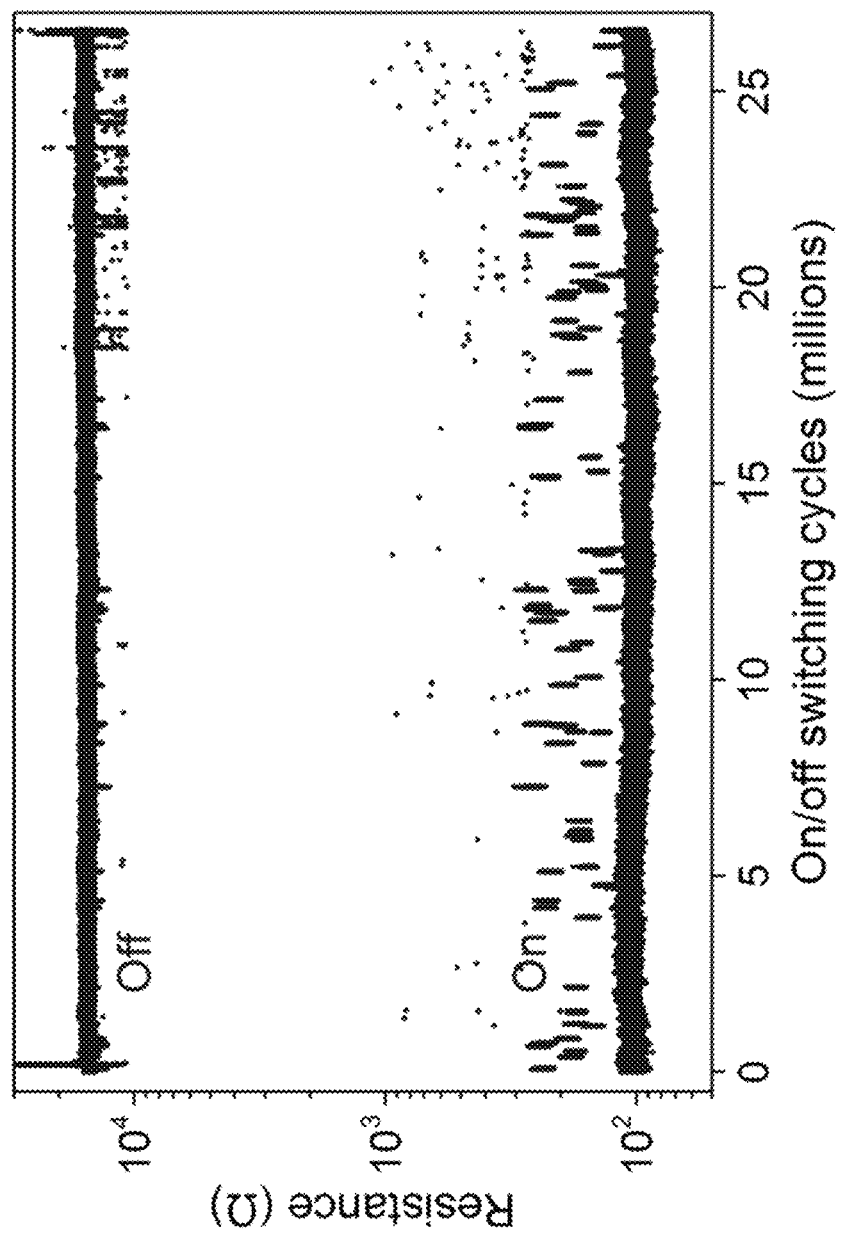
FIG. 14 is a graph showing the results of a pulsed-mode endurance test. The electrical resistance of a tested $VO_2$ device located on the wafer of Example 2 was switched between the "On" state (a low resistance state, LRS) and the "Off" state (a high resistance state, HRS) over 26.6 million cycles of pulsed switching operations. Each switching cycle includes one "Off"-to-"On" switching event and one "On"-to-"Off" switching event.

FIG. 14 is a graph showing the results of a pulsed-mode endurance test. The electrical resistance of a $VO_2$ device located on the wafer of Example 2 was switched between a LRS "On" state and a HRS "Off" state over about 26.6 million pulsed switching operations. Each switching cycle includes one "Off"-to-"On" switching event and one "On"-to-"Off" switching event. All switching events were measured without subsampling. The consistent high- and low-resistance values demonstrate that the device provides consistent and reliable switching behavior without any signs of fatigue or drift over the testing period.

Figure 15:
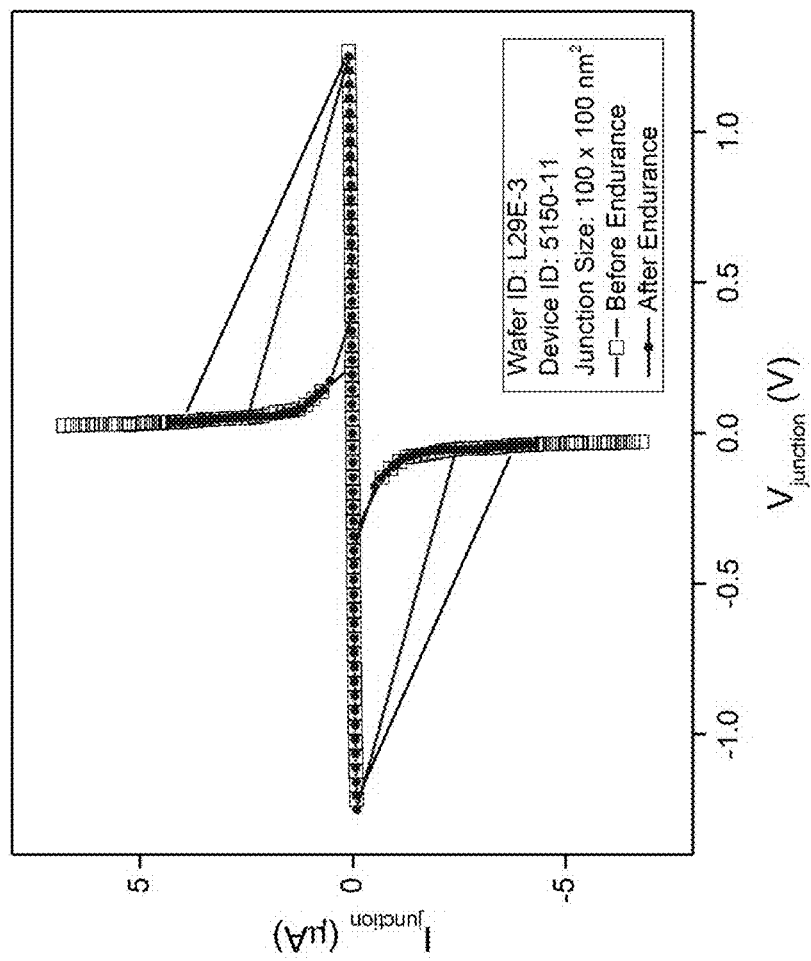
FIG. 15 is an I-V plot of the same $VO_2$ device tested in FIG. 14, comparing the I-V plots under both positive and negative voltage polarities, before (squares) and after (circles) the endurance test including 26.6 million cycles of pulsed switching operations.

FIG. 15 is an I-V plot of the $VO_2$ device tested in FIG. 14, comparing the I-V plots under both positive and negative voltage polarities, before (squares) and after (circles) the pulsed mode endurance test including about 26.6 million switching operations. There is no discernable difference between the two I-V plots, indicating that the device remained essentially intact over the lifetime of the test.

The final device yield of the wafer of Example 2 (e.g., the proportion of viable devices out of the 576 total devices) was found to be greater than about 98%.

The S-type NDR MOM threshold switch devices and electronic oscillator circuits according to embodiments of the present disclosure are envisioned to have advantages in scalability, energy consumption, and biological fidelity over the prior art, particularly in spiking-neuron based neuromorphic computing applications. The devices may have improved scalability due to the MOM crossbar geometry, as well as improved stackability due to the amorphous nature of the active layer. Furthermore, the devices according to embodiments of the present disclosure may have ultra-low energy consumption due to the low Mott transition temperature and scalable active element. In addition, the devices according to embodiments of the present disclosure may have higher biological fidelity and/or complexity due to their inherent nonlinear dynamics and stochastics. Finally, the threshold switch devices and electronic oscillator circuits according to embodiments of the present disclosure are compatible with silicon-based complementary metal-oxide-semiconductor (Si CMOS) processes and devices, enabling use of such devices in large-scale IC integration with on-chip CMOS circuitries for neuromorphic applications.

The devices according to embodiments of the present disclosure may be useful for low-power and high-speed RF switches and oscillators, electrochromic devices (ECDs), infrared optical modulators, spiking-neuron based neuromorphic computing; autonomous robotic vehicles (e.g. unmanned aerial vehicles (UAVs), autonomous underwater vehicles (AUVs), etc.), and autonomous cars. However, embodiments of the present disclosure are not limited thereto.

As used herein, unless otherwise expressly specified, all numbers such as those expressing values, ranges, amounts or percentages may be read as if prefaced by the word "about", even if the term does not expressly appear. As used herein, the terms "substantially", "about", "nearly", and similar terms are used as terms of approximation and not as terms of degree, and are intended to account for the inherent deviations in measured or calculated values that would be recognized by those of ordinary skill in the art. Plural encompasses singular and vice versa. For example, while the present disclosure may describe "an" electrode or "a" substrate, a mixture of such electrodes or substrates can be used. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. As used herein, the terms "combination thereof" and "combinations thereof" may refer to a chemical combination (e.g., an alloy or chemical compound), a mixture, or a laminated structure of components.

It will be understood that although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath", "below", "lower", "under", "above", "upper", and the like, may be used herein for ease of explanation to describe one element or feature's relationship to another element(s) or feature(s) as illustrated in the accompanying drawings. It will be understood that the spatially relative terms are intended to encompass different orientations of the device in use or in operation, in addition to the orientations depicted in the accompanying drawings. For example, if the structures in the accompanying drawings are turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including", when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively.

While the subject matter of the present disclosure has been described in connection with certain embodiments, it is to be understood that the subject matter of the present disclosure is not limited to the disclosed embodiments, but, on the contrary, the present disclosure is intended to cover various modifications and equivalent arrangements included within the spirit and scope of the appended claims, and equivalents thereof.

What is claimed is:

1. A threshold switch device comprising:
a complementary metal-oxide-semiconductor (CMOS)-compatible substrate;
a first electrode on the CMOS-compatible substrate, the first electrode extending along a first direction;
a second electrode on the first electrode, the second electrode extending along a second direction crossing the first direction; and
a switching layer between the first electrode and the second electrode, the switching layer providing a first contact with the first electrode and a second contact with the second electrode at least along a thickness direction (TD) overlap of the device between the first electrode and the second electrode;
the switching layer being a thin film substantially composed of polycrystalline vanadium dioxide ($VO_2$) in the form of nanocrystals that are columnar and vertically continuous from a bottom edge to a top edge of the thin film, the switching layer having no epitaxial relationship with the CMOS-compatible substrate.

2. The threshold switch device of claim 1, wherein the CMOS-compatible substrate comprises a silicon layer below an upper substrate layer, the upper substrate layer being composed of $SiO_2$, $SiN_x$, SiCN, SiCOH, porous SiCOH, or a mixture thereof.

3. The threshold switch device of claim 1, wherein the first electrode is within a trench in the CMOS-compatible substrate, and the first electrode and CMOS-compatible substrate are planarized.

4. The threshold switch device of claim 1, wherein at least one of the first electrode and the second electrode comprises one or more layers of Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon.

5. The threshold switch device of claim 1, wherein the switching layer has the same planar area as the CMOS-compatible substrate.

6. The threshold switch device of claim 1, wherein the switching layer has a thickness of about 5 nm to about 500 nm.

7. The threshold switch device of claim 6, wherein the nanocrystals have an average length of about 5 nm to about 500 nm.

8. The threshold switch device of claim 1, further comprising a dielectric layer on the first electrode and/or the CMOS-compatible substrate, wherein the dielectric layer defines a recess, and the switching layer is surrounded by the dielectric layer and positioned within the recess, and the dielectric layer is composed of $SiO_2$, $SiN_x$, $SiO_xN_y$, $Si_xN_yH_z$, SiCN, SiOF, SiCOH, porous SiCOH, phosphosilicate glass (PSG), borophosphosilicate glass (BSPG), borosilicate glass (BSG), or a mixture thereof.

9. The threshold switch device of claim 1, wherein the device exhibits volatile resistance switching and current-controlled negative differential resistance from the first time a sweeping voltage or voltage pulse is applied across the device.

10. The threshold switch device of claim 9, wherein the volatile resistance switching is between a high resistance state (HRS) at zero bias and a low resistance state (LRS) above a threshold voltage bias.

11. The threshold switch device of claim 1, wherein the threshold switch device is a non-electroformed device.

12. An electrical oscillator circuit based on the threshold switch device of claim 1.

13. The electrical oscillator circuit of claim 12, wherein the electrical oscillator circuit is a regenerative switching circuit that continually oscillates between two states to produce sawtooth output waveforms.

14. The electrical oscillator circuit of claim 12, wherein the electrical oscillator circuit does not require an external pulse to trigger resistive switching.

15. The electrical oscillator circuit of claim 12, comprising:
the threshold switch device;
a load resistor connected in series with the threshold switch device;
a reactive circuit element connected in parallel with the threshold switch device; and
a DC voltage supply,
wherein the oscillation frequency of the electrical oscillator circuit can be controlled by adjusting the DC voltage, adjusting the value of the load resistor, and/or adjusting the value of the reactive circuit element.

16. The electrical oscillator circuit of claim 15, wherein the reactive circuit element is a capacitor.

17. A method of manufacturing a threshold switch device comprising:
providing a complementary metal-oxide-semiconductor (CMOS)-compatible substrate;
depositing a first electrode on the CMOS-compatible substrate to extend along a first direction;
depositing a switching layer composed substantially of polycrystalline vanadium dioxide ($VO_2$) in a thin film over the first electrode, the switching layer having no epitaxial relationship with the CMOS-compatible substrate, and the thin film comprising nanocrystals that are columnar and vertically continuous from a bottom edge to a top edge of the thin film; and
depositing a second electrode over the switching layer to extend along a second direction crossing the first direction;
the switching layer having a first contact with the first electrode and a second contact with the second electrode at least along a thickness direction (TD) overlap of the device between the first electrode and the second electrode, wherein the threshold switch device is not subjected to an electroforming process prior to resistive switching.

18. The method of claim 17, wherein the threshold switching device exhibits volatile resistance switching and current-controlled negative differential resistance from the first time a sweeping voltage or voltage pulse is applied across the device.

* * * * *